United States Patent
Jung et al.

(10) Patent No.: US 11,469,399 B2
(45) Date of Patent: Oct. 11, 2022

(54) DISPLAY DEVICE

(71) Applicant: SAMSUNG DISPLAY CO., LTD., Yongin-si (KR)

(72) Inventors: Soon Il Jung, Cheonan-si (KR); Chi Wook An, Hwaseong-si (KR); Hae Young Yun, Suwon-si (KR); Jung-Hyun Cho, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 198 days.

(21) Appl. No.: 16/902,309

(22) Filed: Jun. 16, 2020

(65) Prior Publication Data
US 2021/0104702 A1    Apr. 8, 2021

(30) Foreign Application Priority Data
Oct. 7, 2019    (KR) .......................... 10-2019-0123996

(51) Int. Cl.
*H01L 51/52*    (2006.01)
*H01L 27/32*    (2006.01)

(52) U.S. Cl.
CPC ........ *H01L 51/5253* (2013.01); *H01L 27/323* (2013.01); *H01L 27/3216* (2013.01); *H01L 27/3218* (2013.01); *H01L 27/3246* (2013.01); *H01L 51/5275* (2013.01)

(58) Field of Classification Search
CPC ... H01L 51/5253–5256; H01L 51/5275; H01L 27/3216; H01L 27/3218; H01L 27/323; H01L 27/3246
See application file for complete search history.

(56) References Cited

U.S. PATENT DOCUMENTS

| 2019/0013495 A1 | 1/2019 | Kim et al. |
| 2019/0165031 A1 | 5/2019 | Shirata et al. |
| 2019/0165061 A1* | 5/2019 | Jung ................... H01L 51/5253 |

(Continued)

FOREIGN PATENT DOCUMENTS

| EP | 3734682 | 11/2020 |
| KR | 10-2018-0005323 | 1/2018 |

(Continued)

OTHER PUBLICATIONS

Extended European Search Report dated Apr. 21, 2021 issued in corresponding European Patent Application No. 20192047.7.

*Primary Examiner* — Shaun M Campbell
(74) *Attorney, Agent, or Firm* — F. Chau & Associates, LLC

(57) ABSTRACT

A display device includes a substrate and a plurality of pixels positioned on the substrate. Each pixel includes a first electrode, a partition wall including a first opening overlapping the first electrode, and a low refractive layer including a second opening overlapping the first opening. The plurality of pixels includes a first plurality of pixels having a first gap between an edge of the first opening and an edge of the second opening and a second plurality of pixels having a second gap between an edge of the first opening and an edge of the second opening. The first gap and the second gap have different lengths from each other. At least one of the first plurality of pixels and at least one of the second plurality of pixels emit light of the same color as each other.

19 Claims, 17 Drawing Sheets

(56) References Cited

U.S. PATENT DOCUMENTS

| | | | |
|---|---|---|---|
| 2020/0350516 A1* | 11/2020 | An | H01L 27/323 |
| 2021/0066667 A1* | 3/2021 | Yun | H01L 51/5281 |
| 2021/0264823 A1* | 8/2021 | Heo | H01L 27/323 |

FOREIGN PATENT DOCUMENTS

| | | |
|---|---|---|
| KR | 10-2019-0041558 | 4/2019 |
| KR | 10-2019-0062678 | 6/2019 |

\* cited by examiner

DISPLAY DEVICE

CROSS-REFERENCE TO RELATED APPLICATION

This application claims priority under 35 U.S.C. § 119 to Korean Patent Application No. 10-2019-0123996, filed on Oct. 7, 2019 in the Korean Intellectual Property Office, the disclosure of which is incorporated by reference in its entirety herein.

1. Technical Field

The present inventive concepts relate to a display device, and more particularly, to a display device including a touch portion that may improve efficiency dispersion.

2. Discussion of Related Art

A light emitting display device is a self-luminous display device that displays an image by using a light emitting diode. The light emitting display device provides features including low power consumption, high brightness, and high response speed.

The display device has a multilayer structure. For example, the display device may have a multilayer structure including a light emitting diode and a touch portion. When light generated by the light emitting diode is emitted to the outside, reflection, total reflection, and the like may occur at an interlayer interface thereof due to the multilayer structure. Some of the light generated by the light emitting diode is dissipated by the reflection, the total reflection, and the like, and thus the light emitting efficiency and display quality of the display device may be degraded.

In addition, the efficiency dispersion of the display device may vary due to an alignment deviation of respective layers of the multilayer structure.

SUMMARY

The present inventive concepts concern a display device with improved efficiency dispersion.

An exemplary embodiment of the present inventive concepts provides a display device including a substrate and a plurality of pixels positioned on the substrate. Each pixel includes a first electrode, a partition wall including a first opening overlapping the first electrode, and a low refractive layer including a second opening overlapping the first opening. The plurality of pixels includes a first plurality of pixels having a first gap between an edge of the first opening and an edge of the second opening in a direction parallel to an upper surface of the substrate. The plurality of pixels further includes a second plurality of pixels having a second gap between an edge of the first opening and an edge of the second opening in the direction parallel to the upper surface of the substrate. The first gap and the second gap have different lengths from each other in the direction parallel to the upper surface of the substrate. At least one of the first plurality of pixels and at least one of the second plurality of pixels emit light of the same color as each other.

A number of pixels having the first gap and a number of pixels having the second gap may be the same.

Each of the first gap and the second gap may be 0.1 μm to 2 μm.

In one pixel, distances in a direction parallel to the substrate between the edges of the first opening and the edges of the second opening may be the same in all directions.

A size of the first c opening may be smaller than that of the second opening in a plan view.

Some of the plurality of pixels may have a third gap between an edge of the first opening and an edge of the second opening in a direction parallel to the substrate, others of the plurality of pixels may have a fourth gap between an edge of the first opening and an edge of the second opening in a direction parallel to the substrate, and the third gap and the fourth gap may have different values.

An average value of the third gap and the fourth gap and an average value of the first gap and the second gap may be the same.

Some of the plurality of pixels may have a fifth gap between an edge of the first opening and an edge of the second opening in a direction parallel to the substrate, others of the plurality of pixels may have a sixth gap between an edge of the first opening and an edge of the second opening in a direction parallel to the substrate, and the fifth gap and the sixth gap may have different values.

An average value of the fifth gap and the sixth gap, an average value of the third gap and the fourth gap, and an average value of the first, gap and the second gap may be the same.

In some of the plurality of pixels, a distance between an edge of the first opening and an edge of the second opening in a direction parallel to the substrate may be an average value of the first gap and the second gap.

The display device may further include a second electrode overlapping the first electrode, a light emitting layer disposed between the first electrode and the second electrode, a thin film encapsulation layer disposed on the second electrode, and a sensing electrode located on the thin film encapsulation layer, and the low refractive layer may be disposed on the sensing electrode.

A high refractive layer disposed in the second opening may be further included.

The low refractive layer may have a refractive index of 1.40 to 1.59, and the high refractive layer may have a refractive index of 1.60 to 1.80.

Another exemplary embodiment of the present inventive embodiments provides a display device that includes a substrate and a plurality of pixels positioned on the substrate. Each pixel includes a first electrode, a partition wall including a first opening overlapping the first electrode, a low refractive layer including a second opening overlapping the first opening, and a high refractive layer positioned in the second opening. The plurality of pixels includes a first plurality of pixels having a first gap between an edge of the first opening and an edge of the second opening in a direction parallel to an upper surface of the substrate. The plurality of pixels also includes a second plurality of pixels having a second gap between an edge of the first opening and an edge of the second opening in the direction parallel to the upper surface of the substrate. The second gap has a length that is different from a length of the first gap. The plurality of pixels includes a third plurality of pixels having a third gap between an edge of the first opening and an edge of the second opening in the direction parallel to the upper surface of the substrate. The third gap has a length that is equal to an average of the lengths of the first gap and the second gap.

A pixel having the first gap, a pixel having the second gap, and a pixel having the average gap may emit light of the same color.

Some of the plurality of pixels may have a third gap between an edge of the first opening and an edge of the second opening in a direction parallel to the substrate, others of the plurality of pixels may have a fourth gap, which is different from the third gap, between an edge of the first opening and an edge of the second opening in a direction parallel to the substrate, and an average value of the third gap and the fourth gap may be the same as that of the first gap and the second gap.

Some of the plurality of pixels may have a fifth gap between an edge of the first opening and an edge of the second opening in a direction parallel to the substrate, others of the plurality of pixels may have a sixth gap, which is different from the fifth gap, between an edge of the first opening and an edge of the second opening in a direction parallel to the substrate, and an average value of the fifth gap and the sixth gap may be the same as that of the first gap and the second pap.

Another exemplary embodiment of the present inventive concepts provides a display device that includes a substrate and a plurality of first electrodes positioned on the substrate. A partition wall having a plurality of first openings respectively overlaps the first electrodes. A light emitting layer is positioned in the first openings. A second electrode is disposed on the light emitting layer. A low refractive layer is disposed on the second electrode and includes a second opening overlapping the first opening. A high refractive layer is positioned in the second opening of the low refractive layer. A length of the first opening is smaller than a length of the second opening in a direction parallel to an upper surface of the substrate. The plurality of first electrodes includes a first plurality of first electrodes having a first gap between an edge of the first opening and an edge of the second opening in the direction parallel to the upper surface of the substrate. The plurality of first electrodes also includes a second plurality of first electrodes having a second gap between an edge of the first opening and an edge of the second opening in the direction parallel to the upper surface of the substrate. The second gap has a length that is different from a length of the first gap.

A color of light emitted from a light emitting layer overlapping the first electrode having the first gap may be the same as that of light emitted from a light emitting layer overlapping the first electrode having the second gap.

In some of the plurality of first electrodes, a distance between an edge of the first opening and an edge of the second opening in a direction parallel to the substrate may be an average value of the first gap and the second gap.

According to exemplary embodiments of the present inventive concepts, a display device having improved efficiency dispersion is provided.

DETAILED DESCRIPTION OF EXEMPLARY EMBODIMENTS

Figure 1:
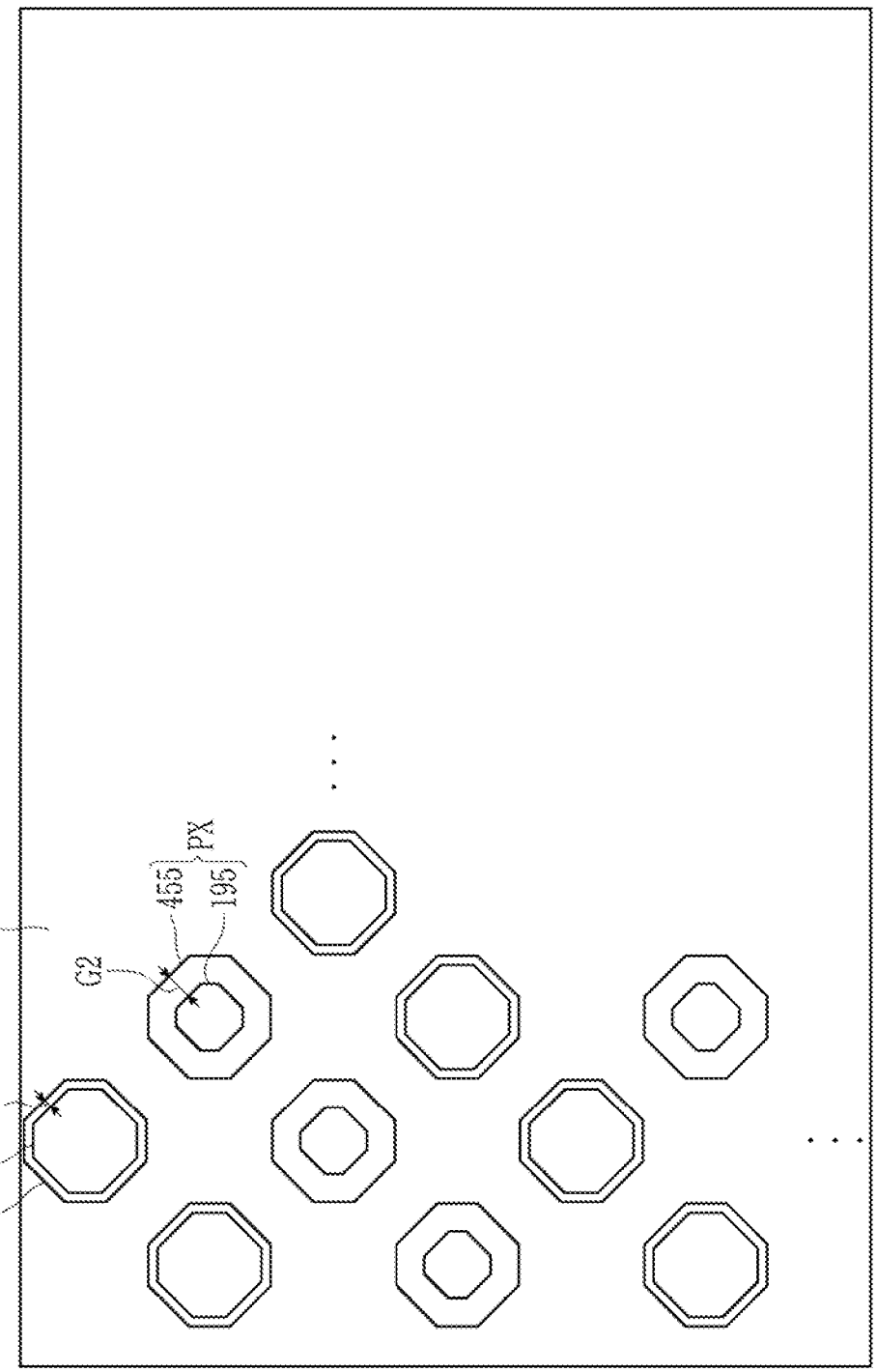
FIG. 1 illustrates a plan view of a display device according to an exemplary embodiment of the present inventive concepts.

The present invention will be described more fully hereinafter with reference to the accompanying drawings, which exemplary embodiments of the present inventive concepts are shown. As those skilled in the art would realize, the described exemplary embodiments may be modified in various different ways, all without departing from the spirit or scope of the present inventive concepts.

Parts that are irrelevant to the description will be omitted to clearly describe the present inventive concepts and like reference numerals designate like elements throughout the specification.

Further, in the drawings, the size and thickness of each element are arbitrarily illustrated for ease of description, and the present inventive concepts are not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" means viewing a target portion from the top, and the phrase "in a cross-section" means viewing a cross-section formed by vertically cutting a target portion from the side.

Hereinafter, a display device according, to an exemplary embodiment of the present inventive concepts will be described in detail with reference to the accompanying drawings.

FIG. 1 schematically illustrates a display device 1000 according to an exemplary embodiment of the present inventive concepts. FIG. 1 mainly illustrates a second opening 455 of a low refractive layer 450 and a first opening 195 of a partition wall according to an exemplary embodiment of the present inventive concepts. A detailed configuration of all pixels including the low refractive layer 450 and the partition wall 190 will be described in detail later with reference to other drawings. Referring to FIG. 1, the first opening 195 is a region in which a light emitting diode layer is positioned and light is emitted thereby, and the second opening 455 of the low refractive layer 450 is a layer that induces total reflection of light emitted from the light emitting diode layer to improve the light emitting efficiency. The first opening 195 and the second opening 455 form one pixel PX.

In FIG. 1, gaps G1 and G2 between edges of the first opening 195 and edges of the second opening 455 are different. In the present specification, the gap between an edge of the first opening 195 and an adjacent edge of the second opening 455 will be referred to as a gap. For example, unless otherwise described, the gap, which is a term used herein, means a distance between the edge of the first opening 195 and the edge of the second opening 455. The distance may be a shortest distance in a direction parallel to the substrate.

In the display device according to an exemplary embodiment of the present inventive concepts, the gap of a first plurality of the pixels is the first distance G1, and the gap of a second plurality of the pixels is the second distance G2. In an exemplary embodiment, among all the pixels of the display device, the number of the first plurality of pixels having a gap with the first distance G1 and a number of the second plurality of pixels having a gap with the second distance G2 are the same. In an exemplary embodiment, a difference between the first gap G1 and the second gap G2 may be about 1 μm. However, exemplary embodiments of the present inventive concepts are a of limited thereto. For example, in other exemplary embodiments, the difference between the first gap G1 and the second gap G2 may be about 0.2 μm to about 4 μm. Efficiency dispersion may be the dispersion of different front light emission efficiency values for a plurality of pixels. The differences in the front light emission efficiency values may be based on differences in the gap sizes of the pixels. The efficiency dispersion of the display device may be reduced by including pixels having gaps, with two or more different values (e.g., lengths). The effects of efficiency dispersion of the display device due to the pixels having gaps with two or more different values will be described later.

Hereinafter, a detailed structure of the display device according to an exemplary embodiment of the present inventive concepts will be described in detail.

Figure 2:
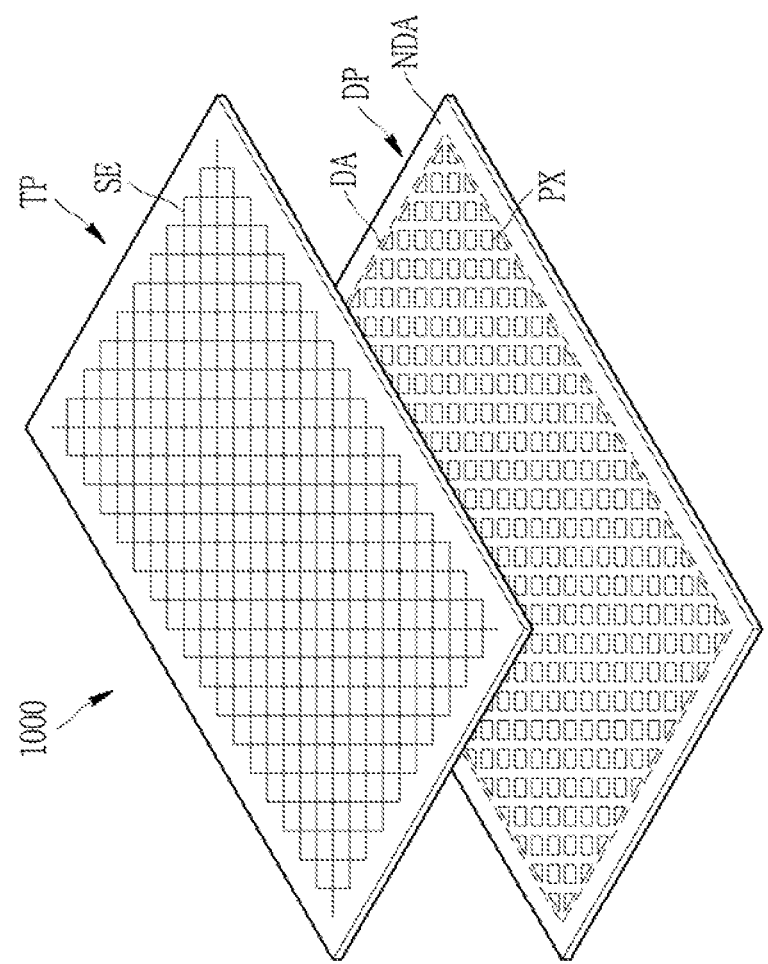
FIG. 2 illustrates an exploded perspective view of a light emitting display device according to an exemplary embodiment of the present inventive concepts.
Figure 3:
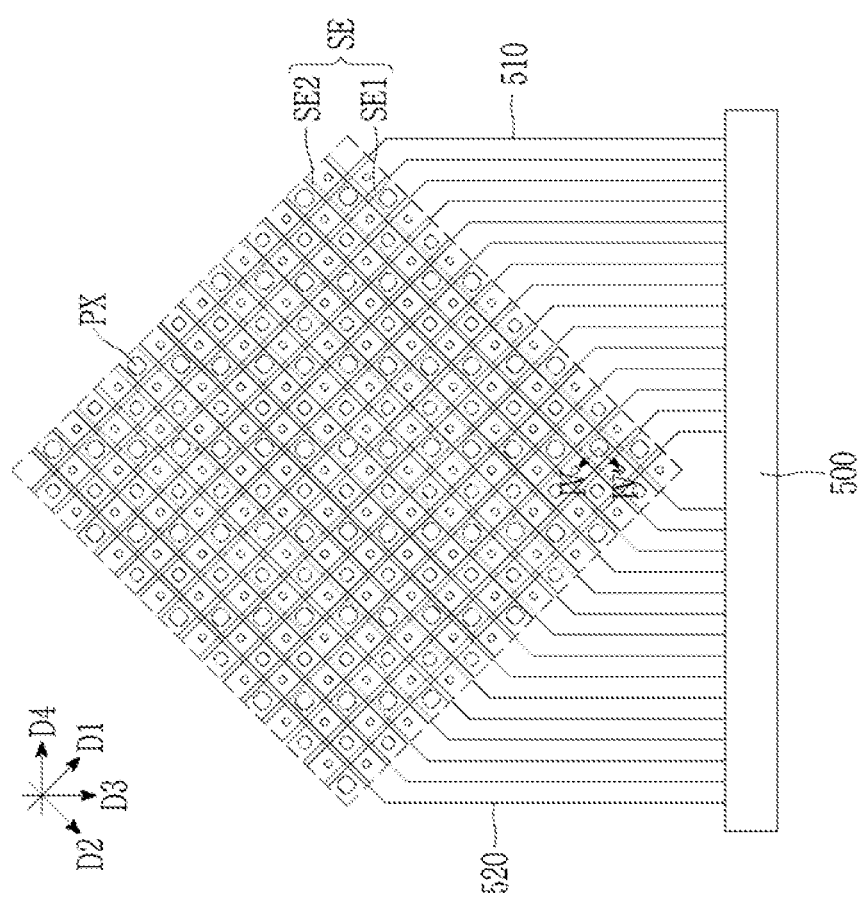
FIG. 3 illustrates an enlarged top plan view of a partial region of FIG. 2.

FIG. 2 illustrates an exploded perspective view of a light emitting display device according to an exemplary embodiment of the present inventive concepts, and FIG. 3 illustrates an enlarged top plan view of a partial region of FIG. 2 according to an exemplary embodiment of the present inventive concepts.

Referring to FIG. 2, the light emitting display device 1000 according to an exemplary embodiment of the present inventive concepts includes a display portion DP and a touch portion TP. In this embodiment, although the display portion DP and the touch portion TP are shown in a form such that they are separated from each other for convenience of description, the display portion DP and the touch portion TP according to the exemplary embodiment of the present inventive concepts are integrally formed. For example, the light emitting display device 1000 according to an exemplary embodiment of the present inventive concepts will be described as having an on-cell structure in which the touch portion TP is directly disposed on the display portion DP without a separate substrate. However, exemplary embodiments of the present inventive concepts are not limited thereto, and an in-cell structure in which the touch portion TP is formed in the display portion DP may be provided.

The display portion DP may be divided into a display area DA and a non-display area NDA. The display portion DP includes a plurality of pixels PX arranged in a matrix form in the display area DA. The plurality of pixels PX according to an exemplary embodiment of the present inventive concepts are illustrated as having a rhombus shape. However, exemplary embodiments of the present inventive concepts are not limited thereto. For example, in other exemplar embodiments, the plurality of pixels PX may have various shapes such as circular shapes, polygonal shapes, etc.

The touch portion TP is disposed on the display portion DP. The touch portion TP includes one or more sensing electrodes SE for detecting presence or absence of touch and touch coordinates.

Referring to the exemplary embodiment shown in FIG. 3, the sensing electrode SE may include a first sensing electrode SE1 extending in a first direction D1, and a second sensing electrode SE2 extending in a second direction D2 crossing the first direction D1.

In an exemplary embodiment, the first sensing electrode SE1 and the second sensing electrode SE2 may be disposed to surround the pixel PX in a plan view.

For example, as shown in the exemplary embodiment of FIG. 3, one pixel PX may be surrounded by the first sensing electrode SE1 and the second sensing electrode SF2. For example, as shown in the exemplary embodiment of FIG. 3, two first sensing electrodes SE1 and two second sensing electrodes SE2 may surround a pixel PX to fully surround the pixel. However, exemplary embodiments of the present inventive concepts are not limited thereto and the configuration of the first sensing electrode SE1 and the second sensing electrode SE2 surrounding pixels may vary. For example, in another exemplary embodiment, a pair of adjacent first sensing electrode SE1 and a pair of adjacent second sensing electrode SE2 may be disposed to surround four pixels PX forming one pixel group in a plan view. The accuracy of touch sensing may vary depending on a degree of density of the first sensing electrode SE1 and the second sensing electrode SE2.

In addition, although the first sensing electrode SE1 and the second sensing electrode SE2 are illustrated as having a mesh electrode shape in a plan view, exemplary embodiments of the present inventive concepts are not limited thereto. For example, in another exemplary embodiment, the first sensing electrode SE1 and the second sensing electrode SE2 may have a surface electrode shape, respectively.

In an exemplary embodiment, the first sensing electrode SE1 and the second sensing electrode SE2 may each include a metal or a transparent conductive oxide (TCO). For example, the transparent conductive oxide (TCO) may include at least one material selected from an indium tin oxide (ITO), an indium zinc oxide (IZO), a zinc oxide (ZnO), carbon nanotubes (CNT), and graphene.

The first sensing electrode SE1 is electrically connected to a first routing wire 510, and the second sensing electrode SE2 is electrically connected to a second routing wire 520. As shown in the exemplary embodiment of FIG. 3, the first routing wire 510 and the second routing wire 520 may extend substantially along a third direction D3, respectively. However, exemplary embodiments of the present inventive concepts are not limited thereto.

The first routing wire 510 and the second routing wire 520 are respectively connected to a touch driver 500. Although the first routing wire 510 and the second routing wire 520 are illustrated as being connected to one touch driver 500, respectively, exemplary embodiments of the present inventive concepts are not limited thereto. For example, in other exemplary embodiments, the first routing wire 510 and the second routing wire 520 may be respectively connected to separate touch drivers 500.

The touch driver 500 may input a driving signal to the first sensing electrode SE1, and determine the presence or absence of the touch and the touch coordinate by using a capacitance change amount or a voltage change amount measured at the second sensing electrode SE2. In an exemplary embodiment, the touch driver 500 may be directly disposed on a substrate as an integrated circuit (IC), or may be formed to have a separate configuration.

Figure 4:
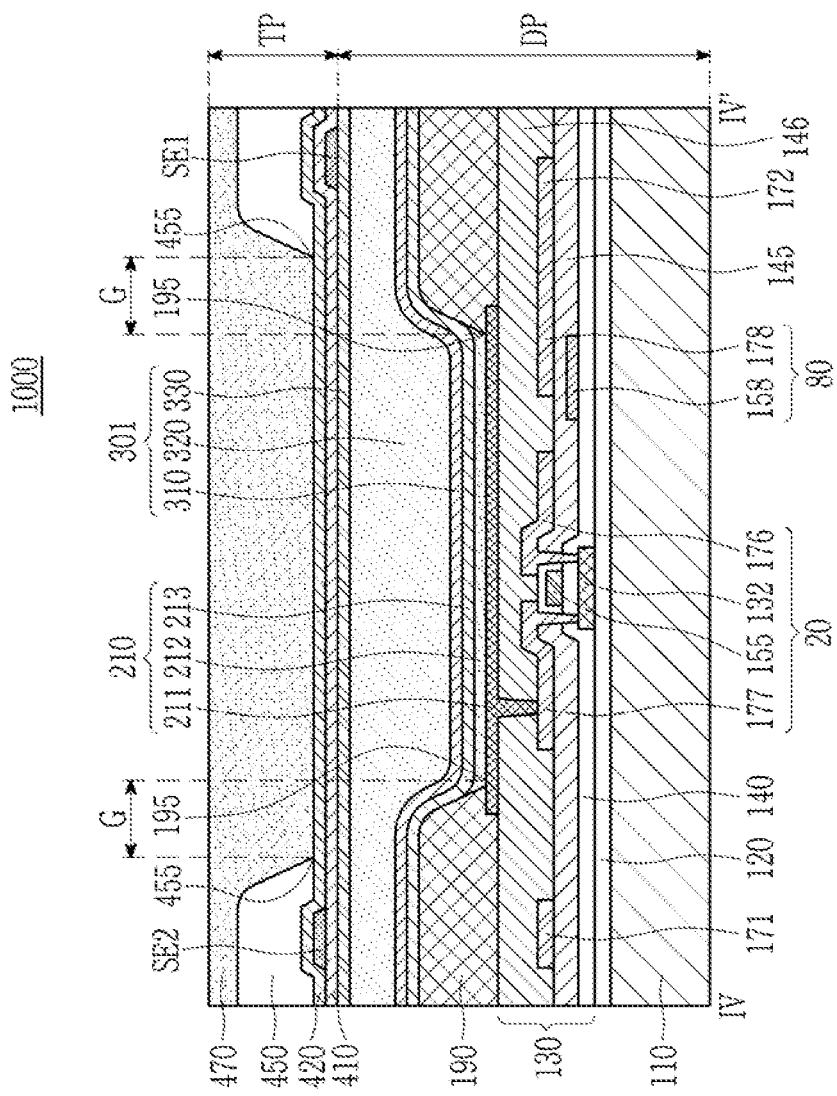
FIG. 4 illustrates a cross-sectional view of a light emitting display device taken along line IV-IV' of FIG. 3 according to an exemplary embodiment of the present inventive concepts.
Figure 5:
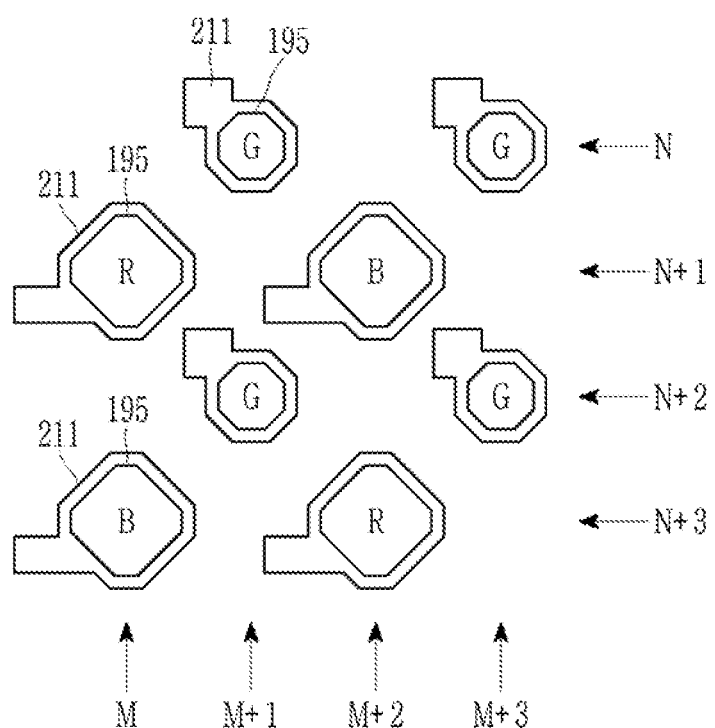
FIG. 5 illustrates a top plan view of a plurality of first electrodes and a plurality of first openings according to an exemplary embodiment of the present inventive concepts.

FIG. 4 illustrates a cross-sectional view of a light emitting display device taken along line IV-IV' of FIG. 3, and FIG. 5 illustrates a schematic top plan view of a plurality of first electrodes and a plurality of first openings according to an exemplary embodiment of the present inventive concepts.

Referring to the exemplary embodiment of FIG. 4, the light emitting display device 1000 includes the display portion DP and the touch portion TP disposed on the display portion DP.

The display portion DP includes a substrate 110, a driving circuit portion 130, a partition wall 190, a light emitting diode 210, and a thin film encapsulation layer 301.

In an exemplary embodiment, the substrate 110 may be made of an insulating material such as glass, quartz, ceramic, and plastic. However, exemplary embodiments of the present inventive concepts are not limited thereto. The substrate 110 may be flexible.

A buffer layer 120 is disposed on the substrate 110. For example, as shown in the exemplary embodiment of FIG. 4, a bottom surface of the buffer layer 120 may directly contact a top surface of the substrate 110. In an exemplary embodiment, the buffer layer 120 may include an inorganic film or an organic film, and may have a multi-layered structure. The buffer layer 120 prevents impurities, moisture, and the like from penetrating into the driving circuit portion 130 and the light emitting diode 210, and simultaneously flattens the surface. However, in another exemplary embodiment of the present inventive concepts, the buffer layer 120 may be omitted.

The driving circuit portion 130 is positioned on the buffer layer 120. For example, as shown in the exemplary embodiment of FIG. 4, a bottom surface of the driving circuit portion 130 may be disposed directly on an upper surface of the buffer layer 120. The driving circuit portion 130 includes a plurality of thin film transistors 20 and capacitors 80 to drive the light emitting diode 210. In addition, the driving circuit portion 130 may include a gate line positioned along one direction, and a data line 171 and a common power line 172 that are insulated from and cross the gate line.

The light emitting diode 210 emits light according to a driving signal received from the driving circuit portion 130 to display an image.

In an exemplary embodiment of the present inventive concepts, the light emitting display device 1000 may have a 2Tr-1Cap structure in which two thin film transistors 20 and one capacitor 80 are provided in one pixel PX, or may have various structures in which three or more thin film transistors 20 and two or more capacitors 80 are provided in one pixel PX. However, exemplary embodiments of the present inventive concepts are not limited thereto.

The capacitor 80 includes a pair of capacitor plates 158 and 178 disposed with an interlayer insulating film 145 therebetween. In this embodiment, the interlayer insulating film 145 becomes a dielectric. The capacity of the capacitor is determined by an electric charge stored in the capacitor 80 and a voltage between the two capacitor plates 158 and 178.

The thin film transistor 20 includes a semiconductor layer 132, a gate electrode 155, a source electrode 176, and a drain electrode 177. The semiconductor layer 132 and the gate electrode 155 are insulated by a gate insulating film 140 that is disposed therebetween. For example, as shown in the exemplary embodiment of FIG. 4, a lower surface of the gate insulating film 140 directly contacts an upper surface of the semiconductor layer 132 and an upper surface of the gate insulating film 140 directly contacts a lower surface of the gate electrode 155. The light emitting diode 210 may include a first electrode 211, a light emitting layer 212 and a second electrode 213. As shown in the exemplary embodiment of FIG. 4, an upper surface of the light emitting layer 212 may directly contact a lower surface of the second electrode 213 and a lower surface of the light emitting layer 212 may directly contact an upper surface of the first electrode 211. The thin film transistor 20 applies driving power to the first electrode 211 for emitting light from the light emitting layer 212 of the light emitting diode 210 in a selected pixel PX. In this embodiment, the gate electrode 155 is connected to the capacitor plate 158, the source electrode 176 and the other capacitor plate 178 are respectively connected to the common power line 172, and the drain electrode 177 is connected to the first electrode 211 of the light emitting diode 210 through an opening located in a planarization film 146.

The planarization film 146 is positioned on the interlayer insulating film 145. For example, as shown in the exemplary embodiment of FIG. 4, a lower surface of the planarization film 146 may directly contact an upper surface of the interlayer insulating film 145. The planarization film 146 is made of an insulating material and protects the driving circuit portion 130. In an exemplary embodiment, the planarization film 146 and the interlayer insulating film 145 may include the same material. However, exemplary embodiments of the present inventive concepts are not limited thereto.

The first electrode 211 is positioned on the planarization film 146. The first electrode 211 may be a pixel electrode and may be an anode. The first electrode 211 is conductive, and may be a transmissive electrode, a transflective electrode, or a reflective electrode.

The partition wall 190 is formed on the planarization film 146 to partition a light emitting region. For example, as shown in the exemplary embodiment of FIG. 4, a lower surface of the partition wall 190 may directly contact an upper surface of the planarization film 146. In this embodiment, the light emitting region is also referred to as a pixel region. In an exemplary embodiment, the partition wall 190 may include a polymer organic material. For example, the partition wall 190 may include at least one material selected from a polyimide (PI)-based resin, a polyacrylic-based resin, a PET resin, and a PEN resin. However, exemplary embodiments of the present inventive concepts are not limited thereto.

The partition wall 190 may include a first opening 195, and the first opening 195 may overlap the first electrode 211 (e.g., in a direction of the thickness of the substrate 110). The first electrode 211 partially overlaps the partition wall 190, and does not overlap the partition wall 190 in the first opening 195. The first opening 195 may be defined as a region of an upper portion of the first electrode 211 that does not overlap the partition wall 190. In addition, a portion where the partition wall 190 and the first electrode 211 contact each other in the first opening 195 is defined as an edge of the first opening 195.

Referring to FIG. 5, the partition wall 190 includes a plurality of first openings 195 respectively corresponding to the plurality of pixels PX. In an exemplary embodiment, the plurality of pixels PX includes a red pixel R emitting red light, a green pixel G emitting green light, and a blue pixel B emitting blue light. In this embodiment, the organic light emitting diode 210 of the red pixel R includes a red light emitting layer, the green light emitting diode 210 of the green pixel G includes a green light emitting layer, and the blue light emitting diode 210 of the blue pixel B includes a blue light emitting layer. However, exemplary embodiments of the present inventive concepts are not limited thereto. For example, in another exemplary embodiment, the plurality of pixels PX may include pixels emitting cyan, magenta, and yellow.

Referring to the exemplary embodiment of FIG. 5, each of the plurality of first openings 195 may have a shape that is similar to the shape of the first electrode 211 in a plan view. For example, as shown in FIG. 5, the edge of the first opening 195 and the first electrode 211 may each have an octagonal shape similar to a rhombus in a plan view (e.g., in a plane parallel to the upper surface of the substrate 110).

In this embodiment, the plurality of first electrodes 211 corresponding to each of the red pixel R, the green pixel G, and the blue pixel B may have different sizes in a plan view (e.g., length in a direction parallel to the upper surface of the substrate 110). Similarly, the plurality of first openings 195 corresponding to each of the red pixel R, the green pixel G, and the blue pixel B may have different sizes in a plan view (e.g., length in a direction parallel to the upper surface of the substrate 110). For example, as shown in FIG. 5, the first opening 195 and the first electrodes 211 corresponding to the red pixels R may be respectively formed to have a larger size than the size of the first opening 195 and the first electrodes 211 corresponding to the green pixels G in a plan view. The first opening 195 and the first electrodes 211 corresponding to the red pixels R may be respectively formed to have a size that is smaller than or equal to the size of the first opening 195 and the first electrode 211 corresponding to the blue pixel B. However, exemplary embodiments of the present inventive concepts are not limited thereto, and each of the first opening 195 and the first electrodes 211 may be formed to have various sizes.

In addition, the light emitting display device 1000 according to an exemplary embodiment may have a pentile structure. However, exemplary embodiments of the present inventive concepts are not limited, thereto. For example, as shown in FIG. 5, in an N-th row, a plurality of first electrodes 211 corresponding to the green light emitting layer are disposed to be spaced apart by a predetermined gap, and in an adjacent (N+1)-th row, the first electrode 211 corresponding to the red light emitting layer and the first electrode 211 corresponding to the blue light emitting layer may be alternately disposed. In a like manner, in an adjacent (N+2)-th row, a plurality of first electrodes 211 corresponding to the green light emitting layer are disposed to be spaced apart by a predetermined gap, and in an adjacent (N+3)-th row, the first electrode 211 corresponding to the blue light emitting layer and the first electrode 211 corresponding to the red light emitting layer may be alternately disposed.

In addition, the first, electrode 211 corresponding to the plurality of green light emitting layers disposed in the N-th row may be alternately disposed with the first electrode 211 corresponding to the plurality of red and blue light emitting layers disposed in the (N+1)-th row. For example, the first electrodes 211 corresponding to the red and blue light emitting layers may be alternately disposed in an M-th column, and the first electrodes 211 corresponding to the plurality of green light emitting layers may be disposed to be spaced apart by a predetermined gap in an adjacent (M+1)-th column. In a like manner, the first electrodes 211 corresponding to the blue and red light emitting layers may be alternately disposed in an adjacent (M+2)-th column, and the first electrodes 211 corresponding to the plurality of green light emitting layers may be disposed to be spaced apart by a predetermined gap in an adjacent (M+3)-th column. For example, the plurality of first electrodes 211 may be repeatedly disposed on the substrate 110 to have the above-described structure. However, exemplary embodiments of the present inventive concepts are not limited thereto.

Referring to the exemplary embodiment of FIG. 4, the light emitting layer 212 is positioned on the first electrode 211. The light emitting layer 212 may be positioned in the first opening 195 of the partition wall 190 and overlap the first electrode 211 (e.g., in a direction of the thickness of the substrate 110).

The light emitting layer 212 includes a light emitting material. In an exemplary embodiment, the light emitting material may be an organic material or an inorganic material such as a quantum dot. In addition, the light emitting layer 212 may include a host and a light emitting dopant. However, exemplary embodiments of the present inventive concepts are not limited thereto.

A second electrode 213 is positioned on the light emitting layer 212. The second electrode 213 may be, a common electrode and may be a cathode. In an exemplary embodiment, the second electrode 213 may be a transmissive electrode, a transflective electrode, or a reflective electrode.

In an exemplary embodiment, at least one of a hole injection layer HIL and a hole transport layer HTL may be further disposed between the first electrode 211 and the light emitting layer 212, and at least one of an electron transport layer ETL, and an electron injection layer EIL may be further disposed between the light emitting layer 212 and the second electrode 213.

The thin film encapsulation layer 301 is disposed on the second electrode 213 to protect the light emitting diode 210.

The thin film encapsulation layer 301 prevents external contaminants such as moisture or oxygen from penetrating into the organic light emitting diode 210.

In an exemplary embodiment, the thin film encapsulation layer 301 may include at least one inorganic film and at least one organic film 320. Referring to the exemplary embodiment of FIG. 4, the thin film encapsulation layer 301 may include a first inorganic film 310 and a second inorganic film 330 and one organic film 320. For example, an upper surface of the organic film 320 may directly contact a lower surface of the second inorganic film 330 and a lower surface of the organic film 320 may directly contact an upper surface of the first inorganic film 310. However, exemplary embodiments of the present inventive concepts are not limited thereto.

In an exemplary embodiment, the first and second inorganic films 310 and 330 include one or more inorganic materials selected from $Al_2O_3$, $TiO_2$, $ZrO$, $SiO_2$, AlON, AlN, SiON, $Si_3N_4$, ZnO, and $Ta_2O_5$. The organic film 320 may include a polymer-based material. Polymer-based materials include an acrylic resin, an epoxy resin, polyimide, and polyethylene. However, exemplary embodiments of the present inventive concepts are not limited thereto.

The dense first and second inorganic films 310 and 330 mainly suppress penetration of moisture or oxygen. Any moisture and oxygen that passes through the first and second inorganic films 310 and 330 are again blocked by the organic film 320. The organic film 320 also serves as a buffer layer to reduce stress between respective films between the first and second inorganic films 310 and 330 in addition to suppressing moisture penetration. In addition, since the organic film 320 has a planarization characteristic, a top surface of the thin film encapsulation layer 301 may be planarized by the organic film 320.

In an exemplary embodiment, the thin film encapsulation layer 301 may have a thickness of about 5 μm to about 50 μm. In embodiments in which the thickness of the thin film encapsulation layer 301 is less than 5 μm or exceeds 50 μm, light emitting efficiency of the light emitting display device 1000 may decrease.

The touch portion TP is disposed on the display portion DP including the substrate 110, the driving circuit portion 130, the partition wall 190, the light emitting diode 210, and the thin film encapsulation layer 301. For example, as shown in the exemplary embodiment of FIG. 4, a bottom surface of the touch portion TP may be disposed directly on an upper surface of the second inorganic film 330 of the thin film encapsulation layer 301.

The first sensing electrode SE1 is positioned on the thin film encapsulation layer 301. In an exemplary embodiment, the first sensing electrode SE1 may include a metal or a transparent conductive oxide (TCO). For example, the transparent conductive oxide (TCO) may include at least one compound selected from an indium tin oxide (ITO), an indium zinc oxide (IZO), a zinc oxide (ZnO), carbon nanotubes (CNT), and graphene.

A first insulating layer 410 is positioned on the thin film encapsulation layer 301 in which the first sensing electrode SE1 is located. For example, as shown in the exemplary embodiment of FIG. 4, a lower surface of the first insulating layer 410 may directly contact an upper surface of the second inorganic film 330 of the thin film encapsulation layer 301 and side and upper surfaces of the first sensing electrode SE1. In an exemplary embodiment, the first insulating layer 410 may include at least one of an inorganic film and an organic film. For example, the inorganic film may include at least one of a metal oxide, a metal oxynitride, silicon oxide, a silicon nitride, and a silicon oxynitride. The organic film may include a polymer-based material.

The second sensing electrode SE2 is positioned on the first insulating layer 410. In an exemplary embodiment, the second sensing electrode SE2 may include a metal or a transparent conductive oxide (TCO). For example, the transparent conductive oxide (TCO) may include at least one of an indium tin oxide (ITO), an indium zinc oxide (IZO), a zinc oxide (ZnO), carbon nanotubes (CNT), and graphene. However, exemplary embodiments of the present inventive concepts are not limited thereto.

Although the touch portion TP according to the exemplary embodiment of the present inventive concepts has been described as including the first sensing electrode SE1 and, the second sensing electrode SE2 that are disposed on different layers, exemplary embodiments of the touch portion TP are not limited thereto. For example, in another exemplary embodiment, the touch portion TP may include the first sensing electrode SE1 and the second sensing electrode SE2 disposed on the same layer and connected to each other by using a bridge electrode.

A second insulating layer 420 is positioned on the first insulating layer 410 in which the second sensing electrode SF2 is disposed. For example, as shown in the exemplary embodiment of FIG. 4, a lower surface of the second insulating layer 420 may directly contact an upper surface of the first insulating layer and side and upper surfaces of the second sensing electrode SE2. In an exemplary embodiment, the second insulating layer 420 may include at least one of an organic film and an inorganic film.

A low refractive layer 450 is positioned on the second insulating layer 420. For example, as shown in the exemplary embodiment of FIG. 4, a lower surface of the low refractive layer 450 may directly contact an upper surface of the second insulating layer 420. In an exemplary embodiment, the low refractive layer 450 may include a light transmissive organic material having a low refractive index. For example, in an exemplary embodiment, the low refractive layer 450 may include at least one material selected from an acrylic resin, a polyimide resin, a polyamide resin, and Alq3 [tris(8-hydroxyquinolinato)aluminum]. However, exemplary embodiments of the present inventive concepts are not limited thereto.

The low refractive layer 450 has a relatively smaller refractive index than a high refractive layer 470 to be described later. For example, the low refractive layer 450 may have a refractive index of about 1.40 to about 1.59.

The low refractive layer 450 includes a second opening 455. The second opening 455 overlaps the first opening 195 (e.g., in a direction of the thickness of the substrate 110).

An edge of the second opening 455 has a shape similar to the shape of an edge of the first opening 195 in a plan view (e.g., in a direction parallel to the upper surface of the substrate 110). The edge of the second opening 455 is defined as a boundary at which the low refractive layer 450 contacts the second insulating layer 420.

In addition, a size (e.g., length in a direction parallel to an upper surface of the substrate 110) of the second opening 455 is larger than the size of the first opening 195 in a plan view. This will be described in further detail later.

In the present specification, a gap G between the second opening 455 and the first opening 195 is measured based on their edges. For example, as shown in the exemplary embodiment of FIG. 4, a distance (e.g., in a direction parallel to an upper surface of the substrate 110) between the edge of the first opening 195 and the edge of the second opening 255 is the gap G. The gap G between the second opening 455 and the first opening 195 may be the shortest distance in a direction parallel to an upper surface of the substrate at the edges of the two openings.

The high refractive layer 470 is positioned on the second insulating layer 420 and the low refractive layer 450. For example, as shown in the exemplary embodiment of FIG. 4, a lower surface of the high refractive layer 470 may directly contact upper surfaces of the second insulating layer 420 and the low refractive layer 450. In an exemplary embodiment, the high refractive layer 470 may include a light transmissive organic material having a high refractive index. The high refractive layer 470 has a relatively larger refractive index than the low refractive layer 450. For example, in an exemplary embodiment, the high refractive layer 470 may have a refractive index of about 1.60 to about 1.80.

The high refractive layer 470 may be located in the second opening 455 of the low refractive layer 450. Further, the high refractive layer 470 may be positioned to overlap the second opening 455 of the low refractive layer 450 and an upper portion of the low refractive layer 450 (e.g., in a direction of the thickness of the substrate 110).

In addition, in an exemplary embodiment, the light emitting display device 1000 may further include a polarizer, an adhesive layer, and a window disposed on the touch portion TP.

The touch portion TP according to an exemplary embodiment of the present inventive concepts includes the low refractive layer 450 including the second opening 455 and the high refractive layer 470 positioned in the second opening 455 of the low refractive layer 450. Therefore, it is possible to improve front visibility and light output efficiency of the light emitting display device 1000. For example, at least some of the light generated by the light emitting diode 210 is reflected at an interface between the low refractive layer 450 and the high refractive layer 470 according to a difference of their refractive indexes. Therefore, the light may be focused in front as will be described in detail with reference to FIG. 6.

Figure 6:
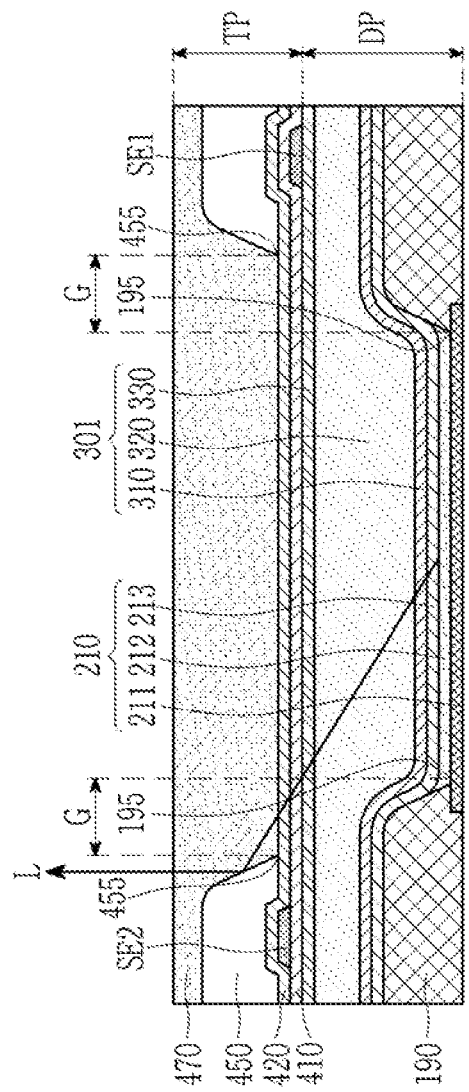
FIG. 6 illustrates a cross-sectional view of a light emitting display device according to an exemplary embodiment of the present inventive concepts.

FIG. 6 illustrates a cross-sectional view of a light emitting display device for explaining reflection of light at an interface between a low refractive layer and a high refractive layer according to an exemplary embodiment of the present inventive concepts. Referring to FIG. 6, light L generated by the light emitting layer 212 may be obliquely incident on the touch portion TP. In this embodiment, at least some of the light L incident on the high refractive layer 470 of the touch portion TP is reflected at the interface between the low refractive layer 450 and the high refractive layer 470. Particularly, as shown in FIG. 6, when an incident angle of the light L incident on the high refractive layer 470 is greater than a critical angle, the incident light L may be totally reflected at the interface between the low refractive layer 450 and the high refractive layer 470. For example, as the light L incident on the high refractive layer 470 having a relatively large refractive index proceeds to the low refractive layer 450 having a relatively small refractive index, the total reflection of light L may occur at the interface between the low refractive layer 450 and the high refractive layer 470.

In this case, the interface between the low refractive layer 450 and the high refractive layer 470 forms an angle of about 40° to about 70° with a line that is parallel to an upper surface of the substrate 110. The interface between the low refractive layer 450 and the high refractive layer 470 may be a lateral side surface of the low refractive layer 450 including the second opening 455 (e.g. the lateral side surface of the low refractive layer 450 extending from the edge of the second opening 455 to an uppermost surface of the low refractive layer 450). For example, the lateral side surface of the low refractive layer 450 may form an angle of about 40° to about 70° in a cross-sectional view with the second insulating layer 420 on which the low refractive layer 450 is located.

In instances in which the angle between the lateral side surface of the low refractive layer 450 and a line that is parallel to an upper surface of the substrate 110 is smaller than 40°, the light L may not be incident on the interface between the low refractive layer 450 and the high refractive layer 470, and thus total reflection may not occur. In contrast, when the angle between the lateral side surface of the low refractive layer 450 and the line that is parallel to an upper surface of the substrate 110 is greater than 70°, the light L totally reflected at the interface between the low refractive layer 450 and the high refractive layer 470 may not be emitted to the front of the light emitting display device 1000. While the substantially entire lateral side surface of the low refractive layer 450 is shown as forming an angle of about 40° to about 70° with the second insulating layer 420 in the exemplary embodiment of FIG. 6, in other exemplary embodiments, a partial portion of the lateral side surface of the low refractive layer 450 may have this angle.

According to an exemplary embodiment of the present inventive concepts, the interface between the low refractive layer 450 and the high refractive layer 470 forms the angle of about 40° to about 70° with the line parallel to an upper surface of the substrate 110. Therefore, the light L incident on the interface between the low refractive layer 450 and the high refractive layer 470 may be totally reflected. Accordingly, the light L may be focused on the front surface of the light emitting display device 1000, and thus, front visibility and light emitting efficiency thereof may be improved.

In addition, the first opening 195 according to, the exemplary embodiment of the present inventive concepts has a smaller size than the second opening 455 in a plan view (e.g., length in a direction parallel to an upper surface of the substrate 110). In an exemplary embodiment, the gap G between the first opening 195 and the second opening 455 may be about 0.1 μm to about 2.0 μm in a plan view (e.g., in a direction parallel to an upper surface of the substrate 110). In addition, in an exemplary embodiment, the gap G between the edge of the first opening 195 and the edge of the second opening may always be constant regardless of a direction thereof.

In addition, in an exemplary embodiment of the present inventive concepts, the display device may include a pixel having a different gap G between the first opening 195 and the second opening 455. For example, a first plurality of pixels may have the first gap G1, and a second plurality of pixels may have the second gap. In an exemplary embodiment, a number of the first plurality of pixels having the first gap and a number of the second plurality of pixels having the second gap G2 may be the same and may comprise all of the pixels in the display device.

In an exemplary embodiment, the difference between the first gap G1 and the second gap G2 may be n a range of about 0.2 μm to about 4 μm. As such, the efficiency dispersion of the display device may be reduced by setting two gaps of the respective pixels of the display device.

Figure 7:
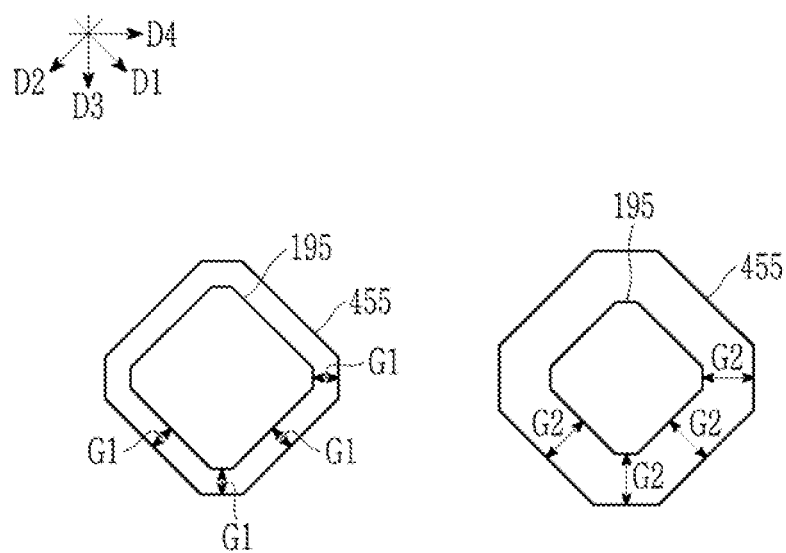
FIG. 7 illustrates a top plan view of a pixel having a first gap and a pixel having a second gap according to an exemplary embodiment of the present inventive concepts.

FIG. 7 illustrates a pixel having a first gap G1 and a pixel having a second gap G2 according to an embodiment of the present invention. Referring to the exemplary embodiment of FIG. 7, the adjacent pixels have a first gap G1 and a second gap G2, respectively, which are different from each other.

The gaps between the first opening 195 and the second opening 455 in one pixel are always constant regardless of the direction. For example, in the pixel shown on the left side of FIG. 7, the gap G1 is substantially the same in between the first opening 195 and the second opening 455 in the portions of the gap extending in the first direction D1, second direction D2, third direction D3, and fourth direction D4, respectively.

However, as shown in FIG. 7, some of the plurality of pixels may have the first gap G1 for the length of the gap between the first opening 195 and the second opening 455, and others of the plurality of pixels may have the second gap G2 for the length of the gap between the first opening 195 and the second opening 455. The gap G1 is smaller than the gap G2. By mixing and disposing the pixels having different gaps G as described above, the light emitting efficiency dispersion of the display device may be reduced.

In an exemplary embodiment, the pixels having the first gap G1 and the second gap G2 may emit light of the same color. For example, in the plurality of pixels emitting light of the same color, some thereof may have the first gap G1 and others thereof may have the second gap G2.

For example, some of the red pixels may have the first gap G1 and others thereof may have the second gap G2. Similarly, some of the green pixels may have the first gap G1 and others thereof may have the second gap G2, and some of the blue pixels may have the first gap G1 and others thereof may have the second gap G2.

Figure 8:
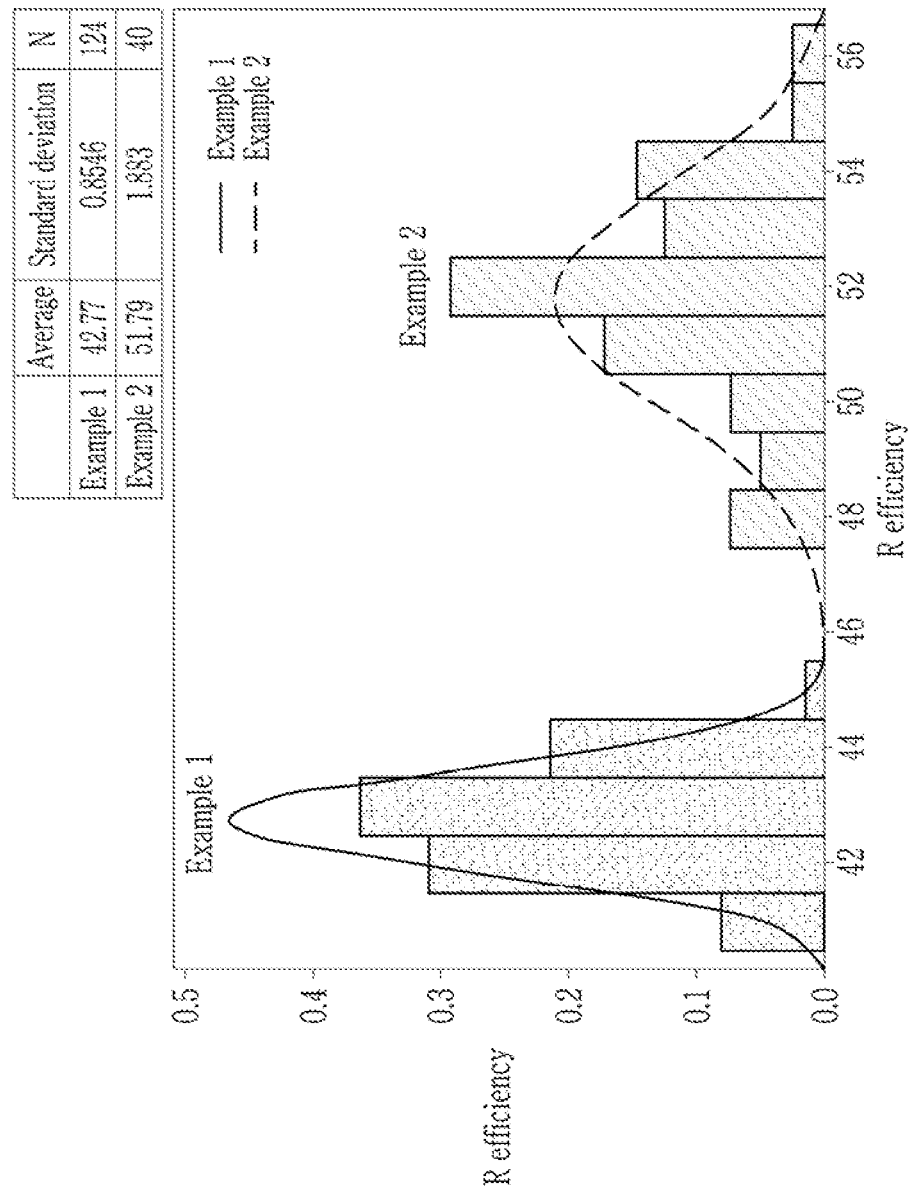
FIG. 8 illustrates a graph showing efficiency dispersion of display devices according to first and second comparative embodiments of the present inventive concepts.
Figure 9:
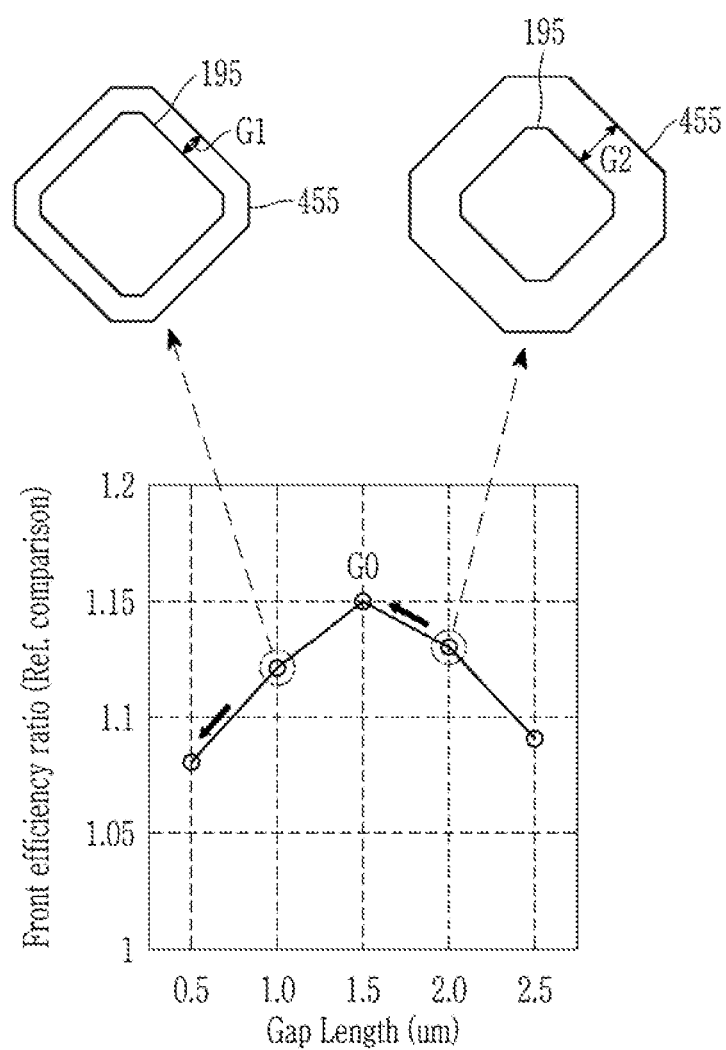
FIG. 9 illustrates a plan view of a pixel having a first gap and a pixel having a second gap and a graph showing the front efficiency ratio according to the gap size according to an exemplary embodiment of the present inventive concepts.
Figure 10:
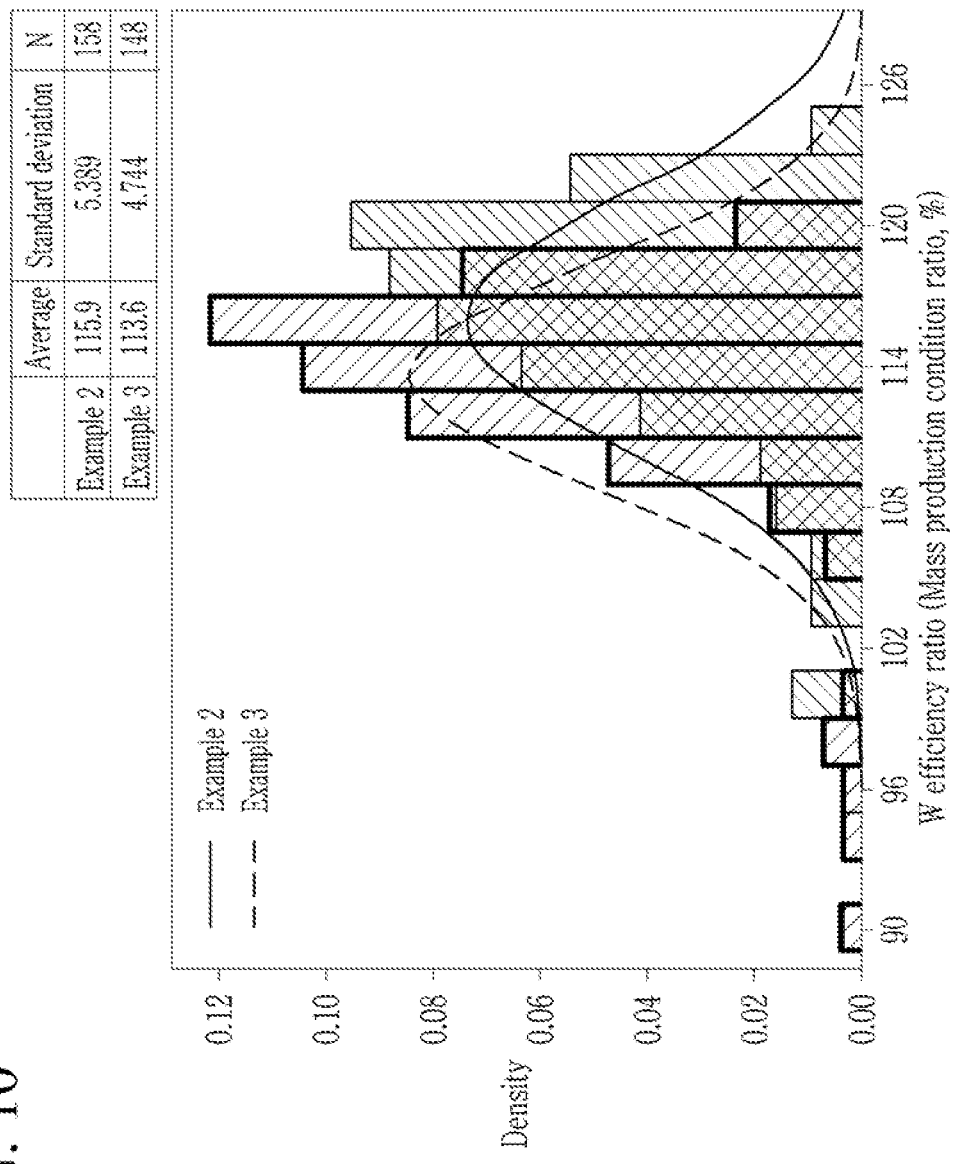
FIG. 10 illustrates a graph showing efficiency dispersion of display devices according to a second comparative embodiment and a third exemplary embodiments of the present inventive concepts.

FIG. 8 illustrates a graph showing efficiency dispersion of display devices according to first and second comparative embodiments. FIG. 9 illustrates a plan view of a pixel having a first gap and a pixel having a second gap and a graph showing the front efficiency ratio according to the gap size between a second opening of a low refractive layer and a first opening of a partition wall. FIG. 10 illustrates a graph showing efficiency dispersion of display devices according to a second comparative embodiment and a third embodiment in accordance with an exemplary embodiment of the present inventive concepts.

In FIGS. 8 to 10, Example 1 is a comparative embodiment of a display device in which the low refractive layer does not include the second opening and does not include the high refractive layer, and Example 2 is a comparative embodiment of a display device in which the low refractive layer includes the second opening and the gaps are the same in all the pixels. Example 3, which is a display device according to the exemplary embodiment of FIG. 1, is a display device in which the low refractive layer includes the second opening and both the pixel having the first gap and the pixel having the second gap exist.

Example 1 of FIG. 8 is a comparative example of a display device that does not include a total reflection structure at the interface of the low refractive layer 450 and the high refractive layer 470. For example, there is no total reflection at the interface of a low refractive layer and a high refractive layer in the comparative example of Example 1. Example 2 is a comparative example of a display device that includes a total reflection structure at the interface of the low refractive layer 450 and the high refractive layer 470 and has gaps having the same size (e.g., length in a direction parallel to an upper surface of the substrate). Example 3 is a display device according to an exemplary embodiment of the present inventive concepts that includes a total reflection structure at the interface of the low refractive layer 450 and the high refractive layer 470 and has two different gaps (total reflection, multiple gaps).

Referring to FIG. 8, it can be seen that Example 2 having the total reflection structure has improved efficiency as compared to Example 1 having no total reflection structure. However, referring to FIG. 8, it can be seen that in Example 2, the efficiency is increased but each efficiency dispersion is widened. As shown in FIG. 8, a standard deviation of Example 1 is about 0.85, but a standard deviation of Example 2 is increased to about 1.8.

That is, even if the gaps are designed to be the same in all the pixels, the gaps between the second opening 455 of the low refractive layer 450 and the first opening 195 of the partition wall 190 may vary, such as due to an alignment error of a mask in the manufacturing process. As such, the gaps are varied by deviations in the manufacturing process, and such a process deviation results in, as shown in FIG. 8, an increase in the efficiency dispersion.

Accordingly, in the display device according to exemplary embodiments of the present inventive concepts, the gaps of respective pixels are specifically designed in the manufacturing process to have different values, that is, to include the first gap G1 and the second gap G2. This may reduce the efficiency dispersion.

FIG. 9 illustrates a principle in which the efficiency dispersion decreases when the gap is designed with different sizes, such as to include the first gap G1 and the second gap G2, and illustrates the front efficiency ratio according to the gap.

Referring to FIG. 9, the graph indicates that the gap between the second opening 455 of the low refractive layer 450 and the first opening 195 of the partition wall 190 is 1.5 μm, the efficiency is maximal. For example, the front efficiency ratio to a reference comparison is equal to about 1.15. In this case, the gap at which the efficiency becomes the maximum value is defined as a center gap G0. When all the gaps are equally formed to be 1.5 μm, as shown in FIG. 8, the efficiency dispersion may be widened due to the process error.

However, as shown in FIG. 9, when some pixels are formed to have a gap of 1.0 μm (G1=G0−0.5 μm) and some pixels are formed to have a gap of 2.0 μm (G2=G0+0.5 μm), the efficiency dispersion may be reduced.

Due to the alignment error, during the manufacturing process thereof, the gap between the second opening 455 and the first opening 195 may be formed to be narrower than a design value as a whole. In this embodiment, as an actual gap of the pixel in which the gap was 1.0 μm (the first gap) in the design becomes narrower than the design value, the front light emission efficiency moves downward as shown by an arrow in FIG. 9. That is, when the gap is narrowed due to the process error, the efficiency of the pixel designed at the first gap (1.0 μm) is reduced.

However, at the same time, when the gap of the pixel designed at the second gap (2.0 μm) is formed narrow by the process error, the front light emission efficiency is increased while the gap is smaller than the design value. This embodiment is shown by the upward oriented arrow in FIG. 9.

For example, even if the gap is smaller (e.g., narrower) than the design value due to the process error, the increased efficiency in the pixel having the second gap G2 compensates for the reduced efficiency in the pixel having the first gap G1, thereby offsetting the deviation in the efficiency. Therefore, the efficiency dispersion of the display device may be entirely reduced. FIG. 9 illustrates the case in which the gap is formed to be narrow due to a process error. However, in the exemplary embodiment in which the gap is formed to be larger (e.g., wider), the efficiency may be compensated in the same manner as in FIG. 9. For example, when the first gap is formed to be larger than the design value such that the efficiency is increased, the second gap is formed to be wider than the design value such that the efficiency is correspondingly decreased. Therefore, the decreased efficiency compensates for the increased efficiency. In this embodiment in which the gap is formed larger than the design value, the arrows move in a direction opposite to the arrows shown in FIG. 9.

FIG. 10 illustrates efficiency dispersion of display devices according to second and third embodiments. Example 2 is a display device in which all the gaps have the same design value of 1.3 µm in all the pixels, and Example 3, which is the display device according to the exemplary embodiment of FIG. 1, includes a pixel having the first gap (0.8 µm) and a pixel having the second gap (1.8 µm).

Referring to FIG. 10, the graph indicates that a standard deviation of Example 3 is reduced as compared to the standard deviation of Example 2. For example, the standard deviation of Example 2 is, illustrated to be 5.389, but it can be confirmed that the standard deviation of Example 3 is reduced to 4.744. Example 3 has an efficiency that is slightly reduced as compared to Example 3 (115.9 as compared to 113.6), but this decrease in efficiency is slight and insignificant.

Figure 11:
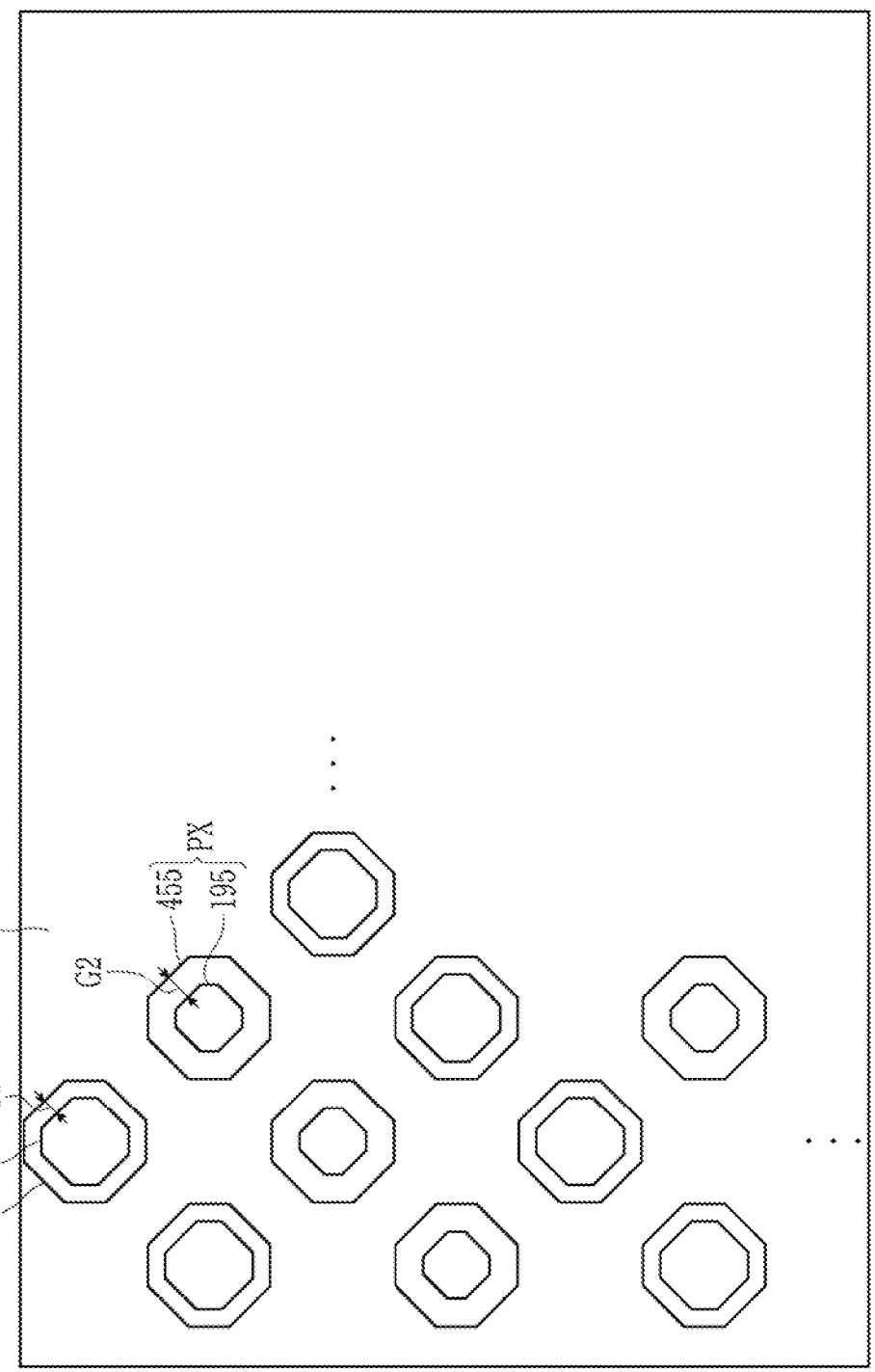
FIG. 11 illustrates a plan view of a display device according to another exemplary embodiment of the present inventive concepts.

FIG. 11 illustrates a plan view of the same region as in FIG. 1 for a display device according to another exemplary embodiment. In the exemplary embodiment of FIG. 1, the difference between the first gap G1 and the second gap G2 is 1.0 µm. In contrast, in the exemplary embodiment of FIG. 11, a difference between the first gap G1 and the second gap G2 may be 0.2 µm. For example, with respect to the central value G0 of the first gap G1 and the second gap G2, the first gap G1 may have a value of ((G0−0.1) µm, and the second gap G2 may have a value of (G0+0.1) µm. However, even in the exemplary embodiment of FIG. 11, the efficiency dispersion may be reduced by the same principle as in the exemplary embodiments of FIGS. 1 and 9.

Figure 12:
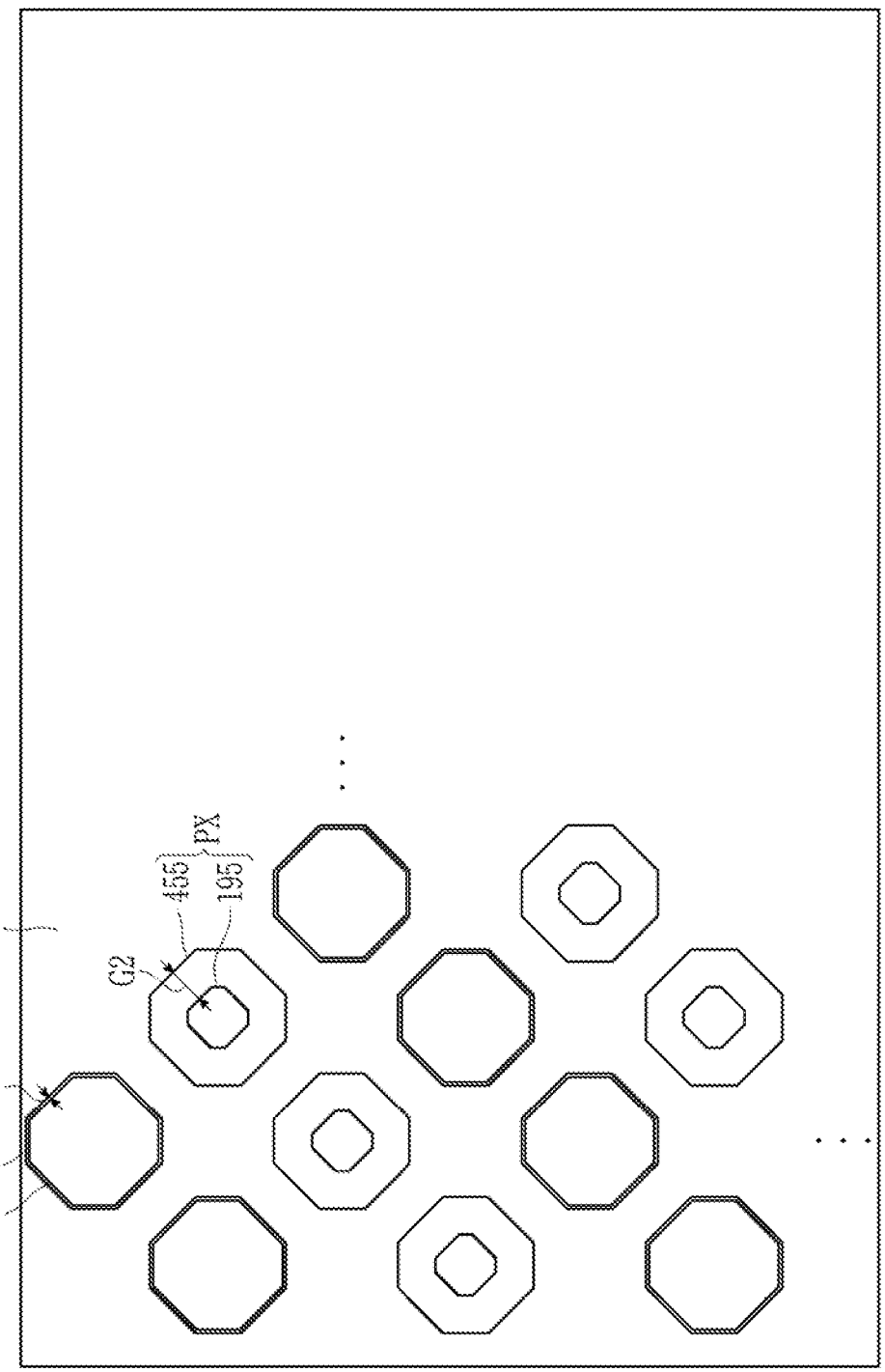
FIG. 12 illustrates a plan view of a display device according to another exemplary embodiment of the present inventive concepts.

FIG. 12 illustrates a plan view of the same region as in FIG. 1 for a display device according to another exemplary embodiment. In the exemplary embodiment of FIG. 1, the difference between the first and second gaps is 1.0 µm. In contrast, in the exemplary embodiment of FIG. 12, a difference between the first and second gaps G1, G2 may be 2.0 µm. For example, with respect to the central value G0 of the first and second gaps, the first gap G1 may have a value of (G0−1.0) µm, and the second gap G2 may have a value of ((G0+1.0) µm. However, even in the exemplary embodiment shown in FIG. 12, the efficiency dispersion may be reduced by the same principle as in the exemplary embodiments of FIGS. 1 and 9.

Figure 13:
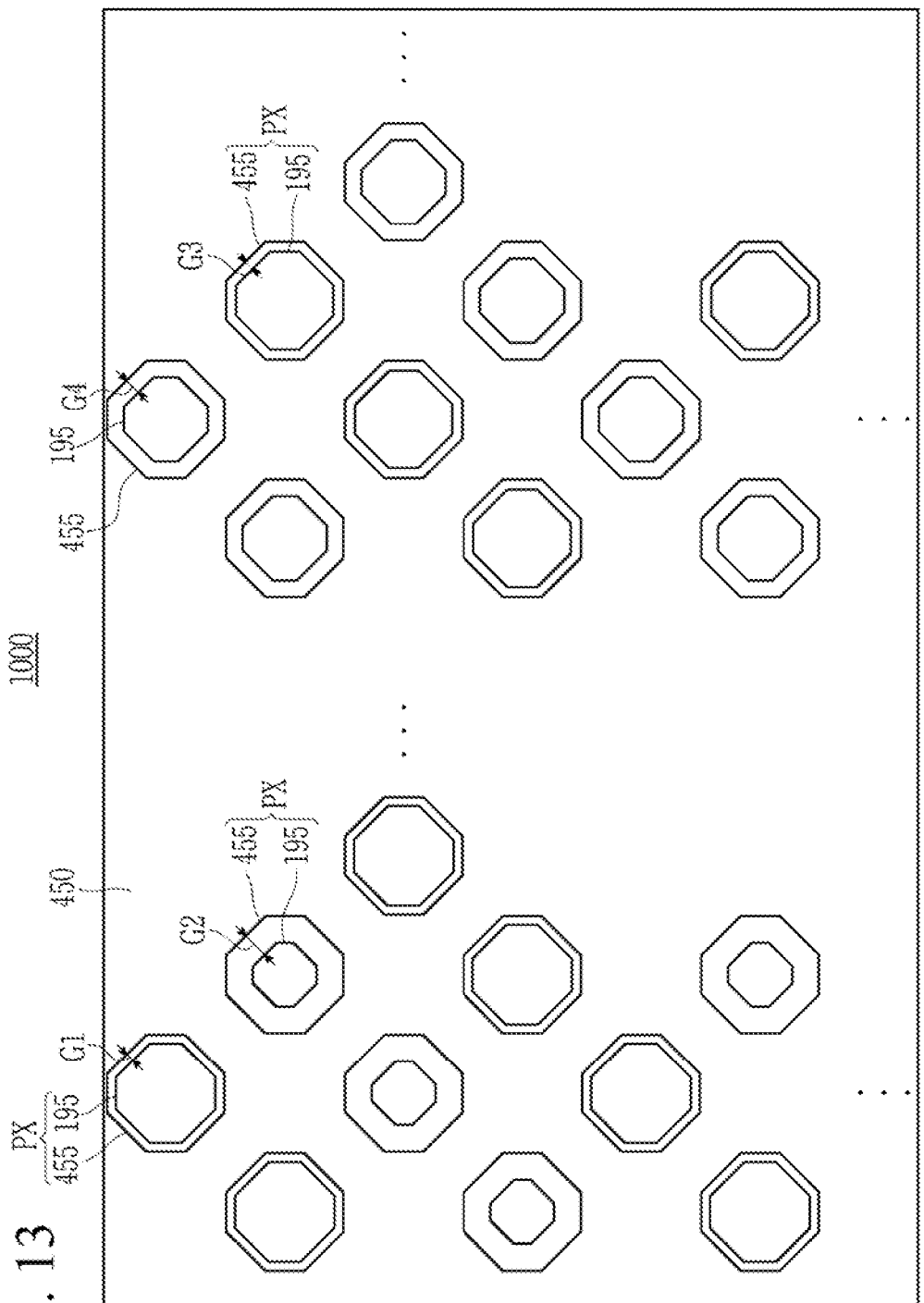
FIG. 13 illustrates a plan view of a display device according to another exemplary embodiment of the present inventive concepts.

FIG. 13 illustrates a plan view of the same region as in FIG. 1 for a display device according to another exemplary embodiment. In the exemplary embodiment of FIG. 13, the display device is the same as the exemplary embodiment of FIG. 1, except that four gaps are provided instead of two gaps. For example, in the display device according to the exemplary embodiment of FIG. 13, a pixel having a difference of 1.0 µm between the first gap G1 and the second gap G2 and a pixel having a difference of 0.2 µm between the third gap G3 and the fourth gap G4 may be mixed. However, exemplary embodiments of the present inventive concepts are not limited thereto. For example, in other exemplary embodiments, the difference between the first gap G1 and the second gap G2 and the difference between the third gap G3 and the fourth gap G4 may be variously selected.

In an exemplary embodiment, a number of the first plurality of pixels having the first gap G1 and the number of the second plurality of pixels having the second gap G2 are the same, and a number of the third plurality of pixels having the third gap G3 and a number of the fourth plurality of pixels having the fourth gap G4 are the same. However, even in the exemplary embodiment of FIG. 13, as in the exemplary embodiment of FIG. 1, the pixel having the second gap G2 compensates for the efficiency deviation due to the alignment error of the pixel having the first gap G1, and the pixel having the fourth gap G4 compensates for the efficiency deviation due to the alignment error of the pixel having the third gap G3. Therefore, the efficiency deviation may be reduced.

In the exemplary embodiment shown in FIG. 13, an average value of the first gap G1, the second gap G2, the third gap G3, and the fourth gap G4 may be the same.

For example, based on a specific average value C, the first gap G1 may be (C−0.5) µm, the second gap G2 may be (C+0.5) µm, the third gap G3 may be (C−0.1) µm, and the fourth gap G4 may be (C+0.1) µm.

Figure 14:
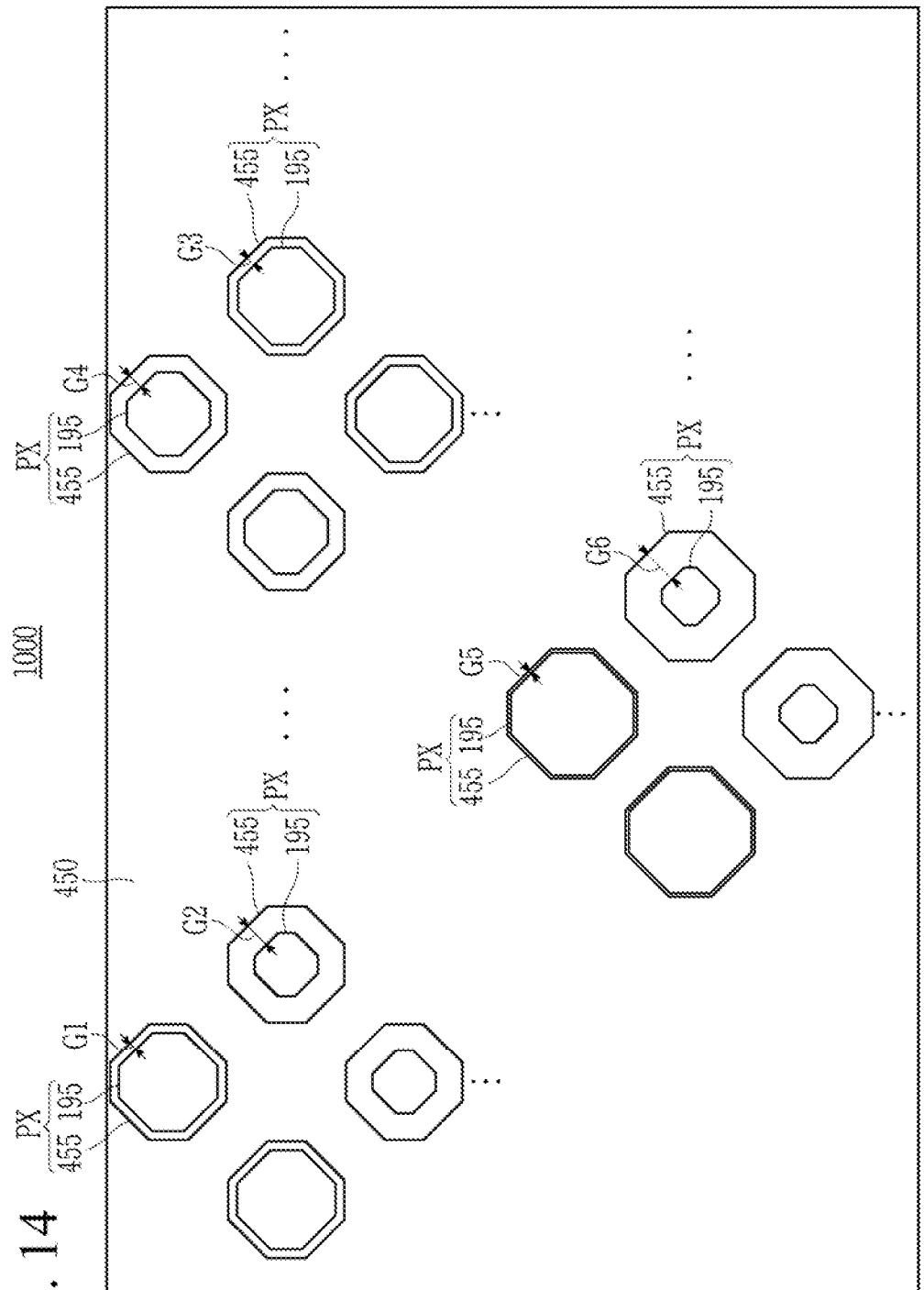
FIG. 14 illustrates a plan view of a display device according to another exemplary embodiment of the present inventive concepts.

Although FIG. 13 illustrates a configuration in which the number of gaps is 4, the number of gaps may be greater than 4. FIG. 14 illustrates the same region as in FIG. 1 with respect to a display device according to another exemplary embodiment. Referring to the exemplary embodiment shown in FIG. 14, the display device is the same as the exemplary embodiment of FIG. 13, except that six gaps are provided instead of four gaps.

For example, in the display device according to the exemplary embodiment of FIG. 14, a pixel in which a difference between the first gap G1 and the second gap G2 is 1.0 µm, a pixel in which a difference between the third gap G3 and the fourth gap G4 is 2.0 µm, and a pixel in which a difference between a fifth gap G5 and a sixth gap G6 is 0.2 µm may be mixed. However, exemplary embodiments of the present inventive concepts are not limited thereto. For example, the difference between the first gap G1 and the second gap G2, the difference between the third gap G3 and the fourth gap G4, and the difference between the fifth gap G5 and the sixth gap G6 may be variously selected.

In the exemplary embodiment shown in FIG. 14, the number of the first plurality of pixels having the first gap G1 and the number of the second plurality of pixels having the second gap G2 are the same, the number of the third plurality of pixels having the third gap G3 and the number of the fourth plurality of pixels having the fourth gap G4 are the same, and the number of the fifth plurality of pixels having the fifth gap G5 and the number of the sixth plurality of pixels having the sixth gap G6 are the same.

However, even in the exemplary embodiment shown in FIG. 14, as in FIG. 13, the pixel having the second gap G2 compensates for the efficiency deviation due to the alignment error of the pixel having the first gap G1, the pixel having the fourth gap G4 compensates for the efficiency deviation due to the alignment error of the pixel having the third gap G3, and the pixel having the sixth gap G6 compensates for the efficiency deviation due to the alignment error of the pixel having the fifth gap G5. Therefore, the efficiency deviation may be reduced.

In the exemplary embodiment shown in FIG. 14, an average value of the first gap G1 and the second gap G2, an average value of the third gap G3 and the fourth gap G4, and an average value of the fifth gap G5 and the sixth gap G6 may be the same.

For example, based on a specific average value C, the first gap G1 may be (C−0.5) µm, the second gap G2 may be (C+0.5) µm, the third gap G3 may be (C−0.1) µm, the fourth gap G4 may be (C+0.1) μm, and the fifth gap G5 may be (C−1.0) μm, and the sixth gap G6 may be (C+1.0) μm.

Figure 15:
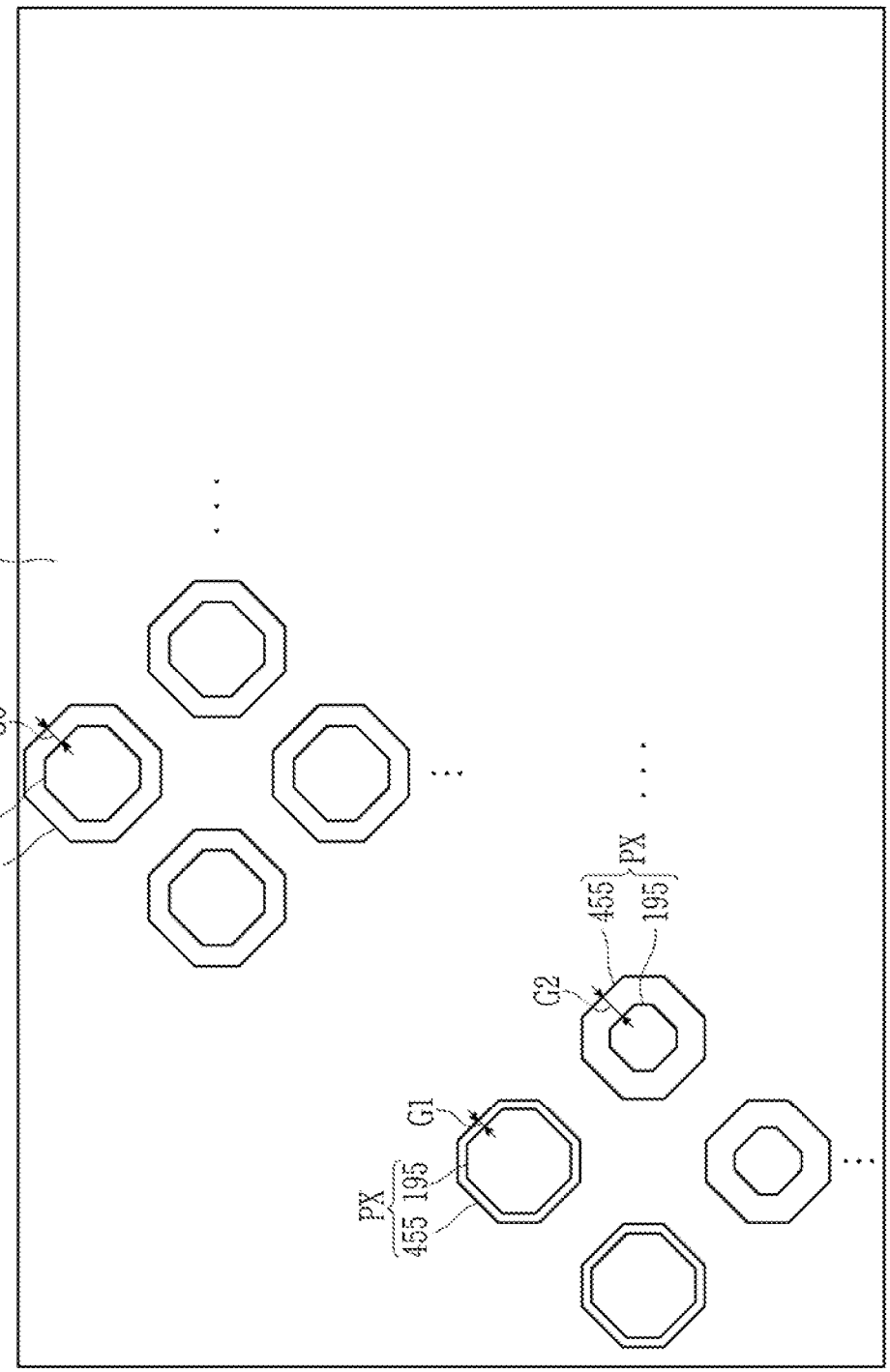
FIG. 15 illustrates a plan view of a display device according to another exemplary embodiment of the present inventive concepts.

FIG. 15 illustrates a plan view of the same region as in FIG. 1 for a display device according to another exemplary embodiment. The display device according to the exemplary embodiment of FIG. 15 is the same as the exemplary embodiment of FIG. 13, except that three gaps of the first gap G1, the second gap G2, and the center gap G0 are included therein. A detailed description of the same components will be omitted. In FIG. 15, the center gap G0 is an average value of the first gap G1 and the second gap G2. For example, a pixel having the first gap G1 (X−a) decreased by (a) based on the center gap G0 (X) and a pixel having the second gap G2 (X+a) increased by (a) based on the center gap G0 (X) may be included. In the exemplary embodiment of FIG. 15, the number of pixels having the first gap G1 and the number of pixels having the second G2 are the same. A range of the center gap G0 may be about 0.5 μm to about 5.0 μm, and a value of (a) may be about 0.1 μm to 1.0 μm.

When the pixels having the first gap G1, the second gap G2, and the center gap G0 which is the average of the first gap G1 and the second gap G2 are mixed, the efficiency dispersion may be reduced without greatly reducing the front emission efficiency. For example, referring to the graph of FIG. 9 as an example, a pixel having the gap of 1.5 μm, a pixel having the gap of 0.5 μm, and a pixel having the gap of 2.0 μm may be mixed. In this embodiment, the average efficiency of the pixels having three gaps is increased, and the efficiency deviation due to the process error is compensated by the pixel having the gap of 0.5 μm and the pixel having the gap of the 2.0 μm. Therefore, the efficiency dispersion may be reduced.

Figure 16:
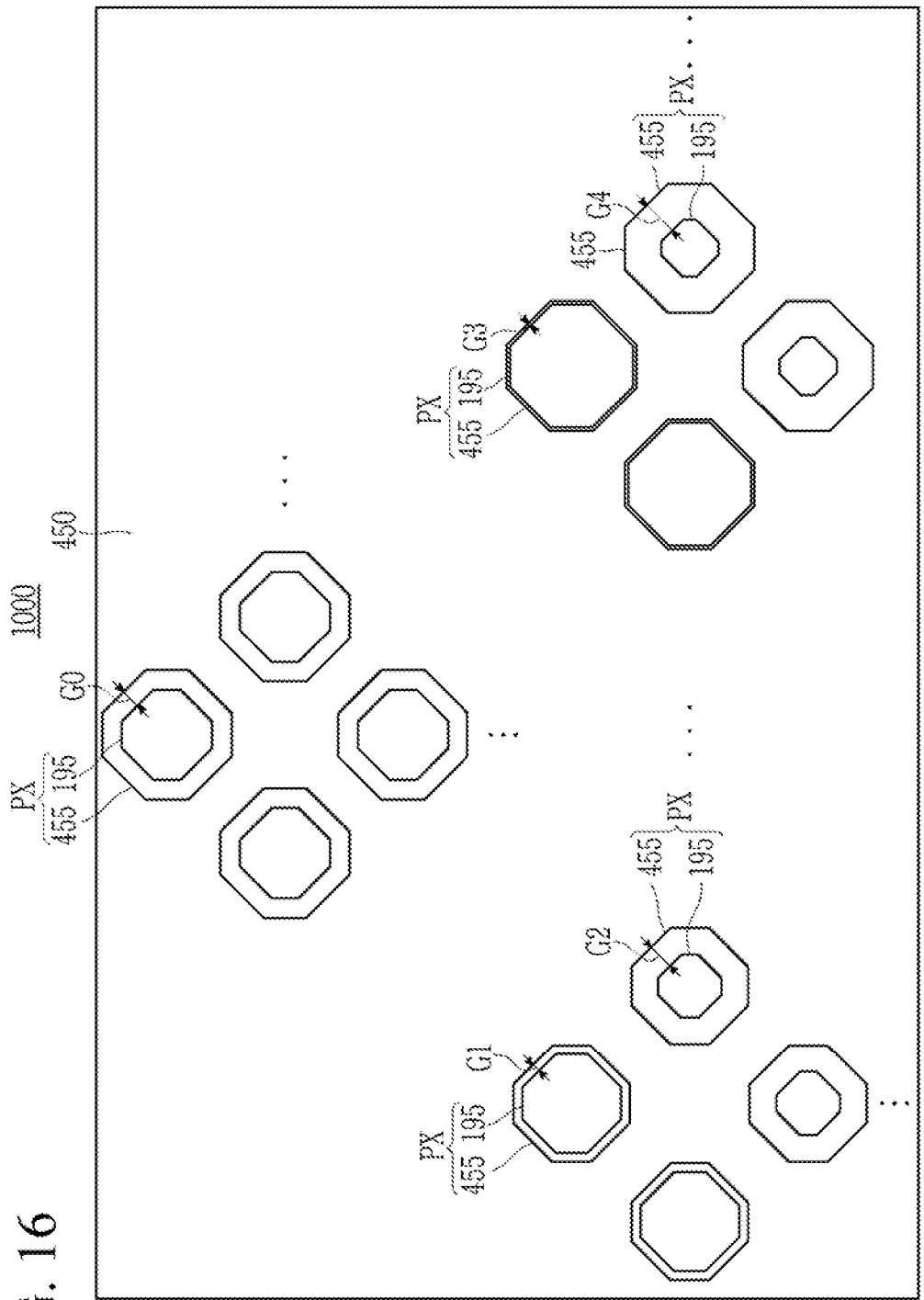
FIG. 16 illustrates a plan view of a display device according to another exemplary embodiment of the present inventive concepts.

FIG. 16 illustrates a plan view of the same region as in FIG. 1 for a display device according to another exemplary embodiment of the present inventive concepts. The display device according to the exemplary embodiment of FIG. 16 is the same as the exemplary embodiment of FIG. 1, except that five gaps of the first gap G1, the second gap G2, the third gap G3, the fourth gap G4, and the center gap G0 are included therein.

The center gap G0 in the exemplary embodiment of FIG. 16 is an average value of the first gap G1 and the second gap G2, and is an average value of the third gap G3 and the fourth gap G4. For example, a pixel having the first gap G1 (X−a) decreased by (a) based on the center gap G0 (X) and a pixel having the second gap G2 (X+a) increased b (a) are included, and a pixel having the third gap G3 (X−b) decreased by (b) based on the center gap G0 (X) and a pixel having the fourth gap G4 (X+b) increased by (b) are included.

In this embodiment, a number of the first plurality of pixels having the first gap G1 and a number of the second plurality of pixels having, the second gap G2 are the same, and a number of the third plurality of pixels having the third gap G3 and a number of the fourth plurality of pixels having the fourth gap G4 are the same.

A range of the center gap G0 (X) may be about 0.5 μm to about 5.0 μm, and a value of the (a) may be about 0.1 μm to about 1.0 μm. A range of a value of the (b) may be about 0.1 μm to about 1.0 μm. The values of the (a) and (b) may not be the same. However, even in the exemplary embodiment of FIG. 16, the efficiency dispersion may be reduced without greatly reducing the front light emission efficiency through the same principle as in FIG. 15.

Figure 17:
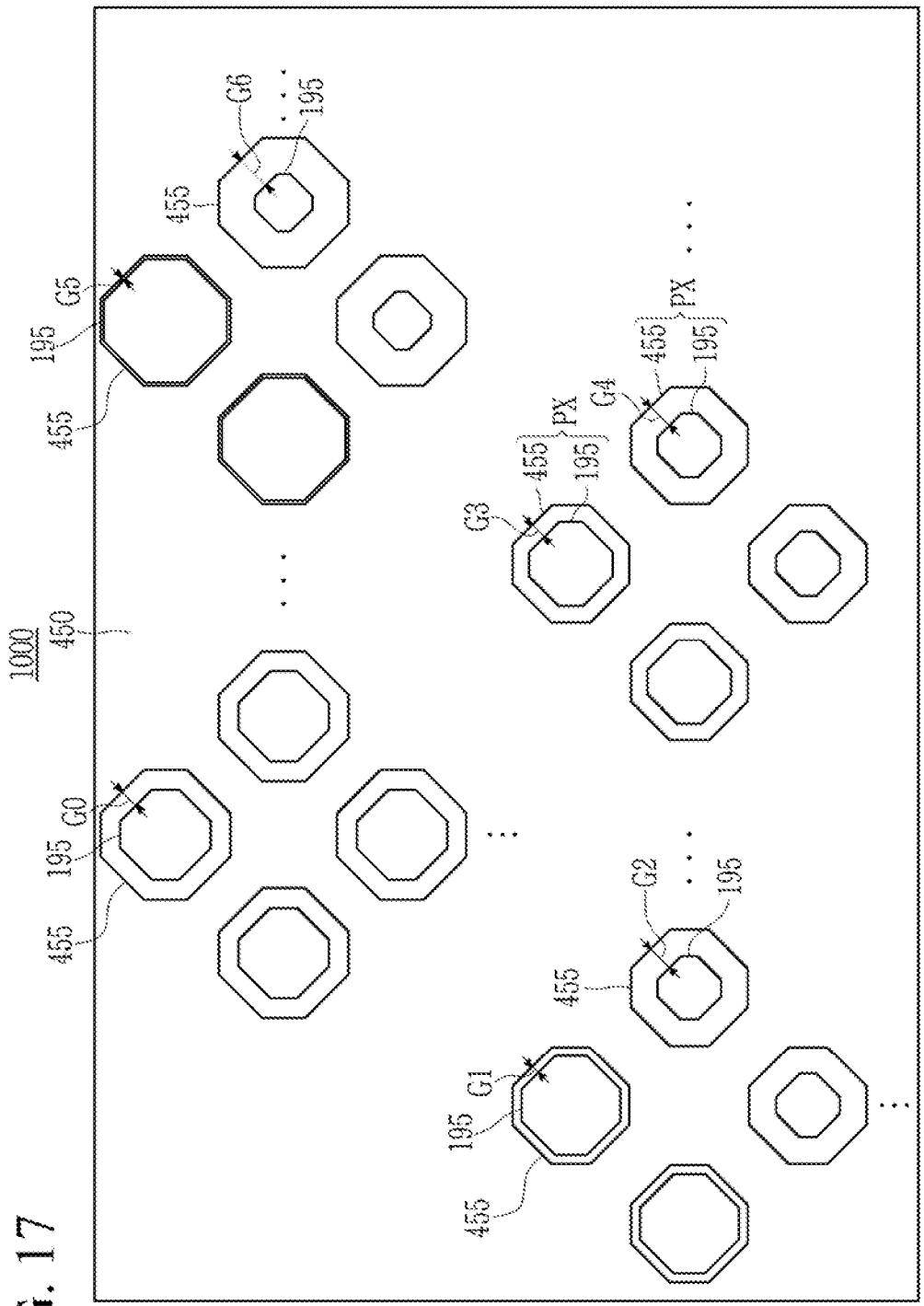
FIG. 17 illustrates a plan view of a display device according to another exemplary embodiment of the present inventive concepts.

FIG. 17 illustrates the same region as in FIG. 16 with respect to a display device according to another exemplary embodiment of the present inventive concepts. The display device according to the exemplary embodiment of FIG. 17 is the same as the exemplary embodiment of FIG. 1, except that five gaps of the first gap G1, the second gap G2, the third gap G3, the fourth gap G4, the fifth gap G5, the sixth gap G6, and the center gap G0 are included therein.

In FIG. 17, the center gap is an average value of the first gap G1 and the second gap G2, an average value of the third gap G3 and the fourth gap G4, and an average value of the fifth gap G5 and the sixth gap G6.

For example, the display device includes a pixel having the first gap G1 (X−a) decreased by (a) based on the center gap G0 (X) and a pixel having the second gap G2 (X+a) increased by (a), a pixel having the third gap G3 (X−h) decreased by (b) based on the center gap G0 (X) and a pixel having the fourth gap G4 (X+h) increased by (b), and a pixel having the fifth gap G5 (X−c) decreased by (c) based on the center gap G0 (X) and a pixel having the sixth gap G6 (X+c) increased by (c).

In this embodiment, a number of the first plurality of pixels having the first gap G1 and a number of the second plurality of pixels having the second gap G2 are the same, a number of the third plurality of pixels having the third gap G3 and a number of the fourth plurality of pixels having the fourth gap G4 are the same, and a number of the fifth plurality of pixels having the fifth gap G5 and a number of the sixth plurality of pixels having the sixth gap G6 are the same.

In an exemplary embodiment, a range of the median gap G0 (X) may be about 0.5 μm to about 5.0 μm, a range of a value of (a) is about 0.1 μm to about 1.0 μm, a range of a value of (b) may be about 0.1 μm to about 1.0 μm, and a range of a value of (c) may be about 0.1 μm to about 1.0 μm. The values of the (a), (b), and (c) may not be the same. However, even in the exemplary embodiment of FIG. 17, the efficiency dispersion may be reduced without greatly reducing the front light emission efficiency through the same principle as in the exemplary embodiment of FIG. 15.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:
1. A display device comprising:
a substrate; and
a plurality of pixels positioned on the substrate,
wherein each pixel includes:
a first electrode,
a partition all including a first opening overlapping the first electrode, and
a low refractive layer including a second opening overlapping the first opening,
wherein the plurality of pixels comprises:
a first plurality of pixels having a first gap between an edge of the first opening and an edge of the second opening in a direction parallel to an upper surface of the substrate,
a second plurality of pixels having a second gap between an edge of the first opening and an edge of the second opening in the direction parallel to the upper surface of the substrate, the first gap and the second gap having different lengths from each other in the direction parallel to the upper surface of the substrate, and wherein at least one of the first plurality of pixels and at least one of the second plurality of pixels emit light of the same color as each other.

2. The display device of claim 1, wherein a total number of the first plurality of pixels having the first gap and a total number of the second plurality of pixels having the second gap are the same.

3. The display device of claim 1, wherein the lengths of the first gap and the second gap are in a range of about 0.1 µm to about 2 µm.

4. The display device of claim 1, wherein in each pixel of the plurality of pixels, a distance in all directions parallel to the upper surface of the substrate between the edges of the first opening and the edges of the second opening are the same.

5. The display device of claim 1, wherein a length of the first opening is smaller than a length of the second opening in the direction parallel to the upper surface of the substrate.

6. The display device of claim 1, wherein the plurality of pixels further includes:
a third plurality of pixels having a third gap between an edge of the first opening and an edge of the second opening in the direction parallel to the upper surface of the substrate,
a fourth plurality of pixels having a fourth gap between an edge of the first opening and an edge of the second opening in the direction parallel to the upper surface of the substrate, and
the third gap and the fourth gap having different lengths from each other in the direction parallel to the upper surface of the substrate.

7. The display device of claim 6, wherein an average of the lengths of the third gap and the fourth gap and an average of the lengths of the first gap and the second gap are the same.

8. The display device of claim 6, wherein the plurality of pixels further includes:
a fifth plurality of pixels having a fifth gap between an edge of the first opening and an edge of the second opening in the direction parallel to the upper surface of the substrate,
a sixth plurality of pixels having a sixth gap between an edge of the first opening and an edge of the second opening in the direction parallel to the upper surface of the substrate, and
the fifth gap and the sixth gap have different lengths from each other in the direction parallel to the upper surface of the substrate.

9. The display device of claim 8, wherein an average of the lengths of the fifth gap and the sixth gap, an average of the lengths of the third gap and the fourth gap, and an average of the lengths of the first gap and the second gap are the same.

10. The display device of claim 1, wherein the plurality of pixels further includes a third plurality of pixels having a third gap between an edge of the first opening and an edge of the second opening in the direction parallel to the upper surface of the substrate, the third gap having a length that is equal to an average of the lengths of the first gap and the second gap.

11. The display device of claim 1, wherein the display device further includes:
a second electrode overlapping the first electrode,
a light emitting layer disposed between the first electrode and the second electrode,
a thin film encapsulation layer disposed on the second electrode, and
a sensing electrode located on the thin film, encapsulation layer,
wherein the low refractive layer is disposed on the sensing electrode.

12. The display device of claim 11, wherein the display device further includes a high refractive layer disposed in the second opening.

13. The display device of claim 12, wherein:
the low refractive layer has a refractive index, of about 1.40 to about 1.59; and
the high refractive layer has a refractive index of about 1.60 to about 1.80.

14. A display device comprising:
a substrate;
a plurality of pixels positioned on the substrate,
wherein each pixel includes:
a first electrode,
a partition wall including a first opening overlapping the first electrode,
a low refractive layer including a second opening overlapping the first opening, and
a high refractive layer positioned in the second opening, and
wherein the plurality of pixels comprises:
a first plurality of pixels having a first gap between an edge of the first opening and an edge of the second opening in a direction parallel to an upper surface of the substrate,
a second plurality of pixels having a second gap between an edge of the first opening and an edge of the second opening in the direction parallel to the upper surface of the substrate, the second gap having a length that is different from a length of the first gap, and
a third plurality of pixels having a third gap between an edge of the first opening and edge of the second opening in the direction parallel to the upper surface of the substrate, the third gap having a length that is equal to an average of the lengths of the first sap and the second gap.

15. The display device of claim 14, wherein at least one pixel of the first plurality of pixels having the first gap, at least one pixel of the second plurality of pixels having the second gap, and at least one pixel of the third plurality of pixels having the third gap emit light of a same color as each other.

16. The display device of claim 14, wherein the plurality of pixels further includes:
a fourth plurality of pixels having a fourth gap between an edge of the first opening and edge of the second opening in the direction parallel to the upper surface of the substrate,
a fifth plurality of pixels having a fifth gap, between an edge of the first opening and an edge of the second opening in the direction parallel to the upper surface of the substrate, the fifth gap having a length that is different from a length of the fourth gap and
an average of the lengths of the fourth gap and the fifth gap is the same as an average of the lengths of the first gap and the second gap.

17. The display device of claim 14, wherein the plurality of pixels further includes:
a sixth plurality of pixels having a sixth gap between an edge of the first opening and an edge of the second opening in the direction parallel to the upper surface of the substrate,
a seventh plurality of pixels having a seventh gap between an edge of the first opening and an edge of the second opening in the direction parallel to the upper surface of the substrate, the seventh gap having a length that is different from a length of the sixth gap, and an average of the lengths of the sixth gap and the seventh gap is the same as an average of the lengths of the first gap and the second gap.

18. A display device comprising:

a substrate;

a plurality of first electrodes positioned on the substrate;

a partition wall having a plurality of first openings respectively overlapping the first electrodes;

a light emitting layer positioned in the first openings;

a second electrode disposed on the light emitting layer;

a low refractive layer disposed on the second electrode and including a second opening overlapping the first opening; and a high refractive layer positioned in the second opening of the low refractive layer, wherein a length of the first opening is smaller than a length of the second opening in a direction parallel to an upper surface of the substrate, wherein the plurality of first electrodes comprises:

a first plurality of first electrodes having a first gap between an edge of the first opening and an edge of the second opening in the direction parallel to the upper surface of the substrate, and a second plurality of first electrodes having a second gap between an edge of the first opening and an edge of the second opening in the direction parallel to the upper surface of the substrate, the second gap having a length that is different from a length of the first gap, wherein a color of light emitted from a light emitting layer overlapping the first plurality of first electrodes having the first gap is the same as a color of light emitted from a light emitting layer overlapping the second plurality of first electrodes having the second gap.

19. The display device of claim 18, wherein the plurality of first electrodes further includes a third plurality of first electrodes having a third gap between an edge of the first opening and, an edge of the second opening in the direction parallel to the upper surface of the substrate, the third gap baying a length that is equal to an average of the lengths of the first gap and the second gap.

* * * * *